United States Patent
Tanno et al.

(10) Patent No.: US 11,340,636 B2
(45) Date of Patent: May 24, 2022

(54) ABNORMALITY DIAGNOSIS METHOD OF FLUID SUPPLY LINE

(71) Applicant: Fujikin Incorporated, Osaka (JP)

(72) Inventors: Ryutaro Tanno, Osaka (JP); Kenji Aikawa, Osaka (JP); Akihiro Harada, Osaka (JP); Yuya Suzuki, Osaka (JP); Takahiro Matsuda, Osaka (JP); Katsunori Komehana, Osaka (JP); Masahiko Ochiishi, Osaka (JP); Tsutomu Shinohara, Osaka (JP)

(73) Assignee: Fujikin Incorporated, Osaka (JP)

( * ) Notice: Subject to any disclaimer, the term of this patent is extended or adjusted under 35 U.S.C. 154(b) by 78 days.

(21) Appl. No.: 16/765,852

(22) PCT Filed: Oct. 5, 2018

(86) PCT No.: PCT/JP2018/037416
§ 371 (c)(1),
(2) Date: May 20, 2020

(87) PCT Pub. No.: WO2019/106959
PCT Pub. Date: Jun. 6, 2019

(65) Prior Publication Data
US 2020/0363826 A1    Nov. 19, 2020

(30) Foreign Application Priority Data
Nov. 29, 2017    (JP) .............................. JP2017-229481

(51) Int. Cl.
*G05D 7/06*    (2006.01)
*F16K 37/00*    (2006.01)
(Continued)

(52) U.S. Cl.
CPC ...... *G05D 7/0664* (2013.01); *C23C 16/45561* (2013.01); *F16K 31/1245* (2013.01); *F16K 37/005* (2013.01); *G07C 3/00* (2013.01)

(58) Field of Classification Search
CPC .............. F16K 31/1245; F16K 37/005; F16K 37/0033; G05D 7/0664; G05D 7/06; C23C 16/45561
See application file for complete search history.

(56) References Cited

U.S. PATENT DOCUMENTS 6,302,130 B1    10/2001  Ohmi et al.
7,853,416 B2 *  12/2010  Nakada ............... G01F 25/0053
                                                          702/47
(Continued)

FOREIGN PATENT DOCUMENTS

JP           3546153 B       7/2004
JP           2016223533     12/2016

*Primary Examiner* — Atif H Chaudry
(74) *Attorney, Agent, or Firm* — Chris Mizumoto

(57) ABSTRACT

To diagnose an abnormality of a fluid control device from an operation of an entire fluid supply line including a plurality of fluid control devices.
Provided is an abnormality diagnosis method of a fluid supply line including a plurality of fluid control devices F, V1, and V2 communicating with each other fluid-tightly. The abnormality diagnosis method has: a valve operation step of opening/closing any one or more of a valve FV in a flow rate control device, a valve V1, and a valve V2; a pressure adjustment step of setting a part or all of flow passages R1 and R2 leading from the valve V1 to the valve V2 via the flow rate control device to a vacuum state or a pressurization state; a pressure detection step of acquiring temporal pressure characteristics in a flow passage of the flow rate control device F by pressure detection mechanisms P1 and P2; and an abnormality determination step of comparing pressure characteristics at the time of abnormality (Continued)

diagnosis acquired by the pressure detection mechanisms P1 and P2 and pressure characteristics at the time of normality measured in advance under the same conditions, and determining whether or not there is an abnormality.

7 Claims, 13 Drawing Sheets

(51) Int. Cl.
    *C23C 16/455*     (2006.01)
    *F16K 31/124*     (2006.01)
    *G07C 3/00*     (2006.01)

(56) References Cited

U.S. PATENT DOCUMENTS

| | | | | |
|---|---|---|---|---|
| 2002/0076492 | A1* | 6/2002 | Loan | F16K 31/1262 |
| | | | | 427/255.28 |
| 2007/0029401 | A1* | 2/2007 | Kaen | A01G 25/16 |
| | | | | 239/69 |
| 2009/0292399 | A1* | 11/2009 | Nagase | G05D 7/0635 |
| | | | | 700/282 |
| 2013/0153036 | A1* | 6/2013 | Young | F16K 37/0041 |
| | | | | 137/1 |
| 2016/0379857 | A1* | 12/2016 | Ogawa | F16K 51/02 |
| | | | | 137/587 |

\* cited by examiner (a)

(b)

ABNORMALITY DIAGNOSIS METHOD OF FLUID SUPPLY LINE

CROSS-REFERENCE

This application is a national phase of an international application, PCT/JP2018/037416, filed on Oct. 5, 2018, which claims the benefit of Japanese Application No. 2017-229481 filed on Nov. 29, 2017.

TECHNICAL FIELD

The present invention relates to technology for diagnosing an abnormality of a fluid supply line having a plurality of fluid control devices.

BACKGROUND ART

A fluid control device such as an automatic valve is used in a fluid supply line that supplies a process fluid used in a semiconductor manufacturing process.

In recent years, a semiconductor manufacturing process such as atomic layer deposition (ALD) is advanced, and a fluid supply line capable of finely controlling a process fluid more than ever is demanded. In order to meet the demand of the advanced semiconductor manufacturing process, for example, a fluid control device capable of monitoring a state of a valve more precisely is proposed.

In this regard, Patent Literature 1 proposes a valve that includes a body provided with a first flow passage and a second flow passage and a valve element causing the first flow passage and the second flow passage to communicate with or block each other. The body has a base portion that has a first plane located at the side of the valve element and a second plane located at the side opposite to the first plane, a first connection portion that has a third plane forming a step portion with the second plane, and a second connection portion that has a fourth plane forming a step portion with the first plane. The first flow passage has a 1-1 flow passage and a 1-2 flow passage. A 1-1 port of the 1-1 flow passage is opened to the third plane, a 1-3 port of the 1-2 flow passage communicates with a 1-2 port of the 1-1 flow passage and is opened to the valve element, a 1-4 port of the 1-2 flow passage is opened to the fourth plane, and the first flow passage and the second flow passage can communicate with each other via the 1-3 port. The first connection portion is connected to a portion corresponding to the second connection portion in a body of another valve, and the 1-1 flow passage and a flow passage corresponding to the 1-2 flow passage in the body of another valve communicate with each other.

Further, as technology for diagnosing an abnormality of the valve, Patent Literature 2 proposes an orifice clogging detection method in a pressure type flow rate control device. The flow rate control device includes a control valve, an orifice, a pressure detector for detecting an upstream side pressure between them, and a flow rate setting circuit. The flow rate control device holds the upstream side pressure at about twice or more a downstream side pressure, calculates a flow rate of the downstream side, and controls opening/closing of the control valve, on the basis of a difference signal between the calculated flow rate and a setting flow rate. The orifice clogging detection method includes a first step of holding the setting flow rate at a high setting flow rate of a 100% flow rate, a second step of switching the high setting flow rate to a low setting flow rate of a 0% flow rate, holding the low setting flow rate, and measuring the upstream side pressure to obtain pressure attenuation data, a third step of comparing the pressure attenuation data and reference pressure attenuation data measured when the orifice has no clogging under the same conditions, and a fourth step of reporting clogging when the pressure attenuation data after a predetermined time elapses from switching to the low setting flow rate is separated from the reference pressure attenuation data by a predetermined degree or more.

CITATION LIST

Patent Literature

Patent Literature 1: JP 2016-223533 A
Patent Literature 2: Japanese Patent No. 3546153

SUMMARY OF INVENTION

Technical Problem

However, in the fluid supply line including the plurality of fluid control devices, each fluid control device is affected by an opening/closing operation of another fluid control device, a flow rate change, or the like. For this reason, accuracy required for the advanced semiconductor manufacturing process cannot be secured only by diagnosing the presence or absence of an operation abnormality independently for each fluid control device.

Further, if electric wiring or an air tube is complicated due to high functionality of the fluid control device, the complicated electric wiring causes noise or delay in the transmission speed of an instruction signal, and an increase in the inner volume of the air tube decreases an opening/closing speed of the fluid control device or causes an error in the opening/closing speed of each fluid control device. This disturbs accurate and precise diagnosis even when the presence or absence of an abnormality is diagnosed.

Accordingly, an object of the present invention is to diagnose an abnormality of a fluid control device from an operation of an entire fluid supply line including a plurality of fluid control devices.

Solution to Problem

In order to achieve the above object, an abnormality diagnosis method of a fluid supply line according to the present invention is an abnormality diagnosis method of a fluid supply line including a plurality of fluid control devices communicating with each other fluid-tightly. The fluid supply line includes a flow rate control device that is connected to a mechanism outside the fluid supply line by a first connection mechanism and has a valve in the flow rate control device and a pressure detection mechanism that detects a pressure in a flow passage, a first valve that is connected to the mechanism outside the fluid supply line by a second connection mechanism branched from the first connection mechanism and is disposed on the upstream side of the flow rate control device, and a second valve that is connected to the mechanism outside the fluid supply line by the second connection mechanism branched from the first connection mechanism and is disposed on the downstream side of the flow rate control device. The abnormality diagnosis method includes: a valve operation step of opening/closing any one or more of the valve in the flow rate control device, the first valve, and the second valve; a pressure adjustment step of setting a part or all of flow passages leading from the first valve to the second valve via the flow rate control device to a vacuum state or a pressurization state; a pressure detection step of acquiring temporal pressure characteristics in the flow passage of the flow rate control device by the pressure detection mechanism; and an abnormality determination step of comparing pressure characteristics at the time of abnormality diagnosis acquired by the pressure detection mechanism and pressure characteristics at the time of normality measured in advance under the same conditions, and determining whether or not there is an abnormality.

Further, the valve operation step may be configured by a first step of opening the first valve, a second step of closing the valve in the flow rate control device, a third step of opening the second valve, and a fifth step of closing the second valve from a state where the inside of a flow passage leading from a valve portion of the valve in the flow rate control device to a valve portion of the second valve is evacuated, the pressure adjustment step may be configured by a fourth step of setting the inside of the flow passage leading from the valve portion of the valve in the flow rate control device to the valve portion of the second valve to a vacuum state, after the third step, and the pressure detection step may be configured by a sixth step of acquiring temporal pressure characteristics in the flow passage leading from the valve portion of the valve in the flow rate control device to the valve portion of the second valve by the pressure detection mechanism, after executing the fifth step.

Further, the valve operation step may be configured by a first step of closing the first valve, a second step of opening the valve in the flow rate control device, a third step of opening the second valve, and a fifth step of closing the second valve from a state where the inside of a flow passage leading from a valve portion of the first valve to a valve portion of the second valve via the flow passage of the flow rate control device is evacuated, the pressure adjustment step may be configured by a fourth step of setting the inside of the flow passage leading from the valve portion of the first valve to the valve portion of the second valve via the flow passage of the flow rate control device to a vacuum state, after the third step, and the pressure detection step may be configured by a sixth step of acquiring temporal pressure characteristics in the flow passage leading from the valve portion of the first valve to the valve portion of the second valve via the flow passage of the flow rate control device by the pressure detection mechanism, after executing the fifth step.

Further, the valve operation step may be configured by a first step of opening the first valve, a second step of opening the valve in the flow rate control device, a third step of closing the second valve, and a fifth step of closing the valve in the flow rate control device from a state where the inside of a flow passage leading from a valve portion of the first valve to a valve portion of the second valve via the flow passage of the flow rate control device is pressurized, the pressure adjustment step may be configured by a fourth step of setting the inside of the flow passage leading from the valve portion of the first valve to the valve portion of the second valve via the flow passage of the flow rate control device to a pressurization state, after the third step, and the pressure detection step may configure a sixth step of acquiring temporal pressure characteristics in the flow passage leading from the valve portion of the first valve to the valve portion of the second valve via the flow passage of the flow rate control device by the pressure detection mechanism, after executing the fifth step.

Further, the valve operation step may be configured by a first step of opening the first valve, a second step of opening the valve in the flow rate control device, a third step of closing the second valve, a fifth step of closing the valve in the flow rate control device from a state where the inside of a flow passage leading from a valve portion of the valve in the flow rate control device to a valve portion of the second valve is pressurized, and a sixth step of opening the second valve after closing the valve in the flow rate control device, the pressure adjustment step may be configured by a fourth step of setting the inside of the flow passage leading from the valve portion of the valve in the flow rate control device to the valve portion of the second valve to a pressurization state, after the third step, and the pressure detection step may configure a seventh step of acquiring temporal pressure characteristics in the flow passage leading from the valve portion of the valve in the flow rate control device to the valve portion of the second valve by the pressure detection mechanism, after executing the sixth step.

Further, each of the first connection mechanism and the second connection mechanism may be a drive pressure supply path that supplies a drive fluid used for driving the fluid control device from the mechanism outside the fluid supply line.

Further, each of the first connection mechanism and the second connection mechanism may be electric wiring that enables communication between the mechanism outside the fluid supply line and the fluid control device.

Further, a plurality of fluid supply lines may be arranged in parallel to configure a gas unit, and the first connection mechanism may branch for each of the plurality of fluid supply lines in the vicinity of the gas unit, and may be connected to each predetermined fluid control device on the plurality of fluid supply lines.

Further, the flow rate control device may be a flow rate range variable type flow rate control device. The flow rate range variable type flow rate control device may have at least a fluid passage for a small flow rate and a fluid passage for a large flow rate as a fluid passage to a flow rate detection unit of the flow rate control device. The flow rate range variable type flow rate control device may circulate a fluid in a small flow rate region to the flow rate detection unit through the fluid passage for the small flow rate and switch a detection level of a flow rate control unit to a detection level suitable for the detection of the flow rate of the small flow rate region, and may circulate a fluid in a large flow rate region to the flow rate detection unit through the fluid passage for the large flow rate and switch the detection level of the flow rate control unit to a detection level suitable for the detection of the flow rate of the large flow rate region, thereby switching the fluid in each of the large flow rate region and the small flow rate region to control the flow rate.

Further, the flow rate control device may be a differential pressure type flow rate control device. The differential pressure type flow rate control device may have a control valve including a valve drive unit, an orifice provided on the downstream side of the control valve, a detector for a fluid pressure of the upstream side of the orifice, a detector for a fluid pressure of the downstream side of the orifice, a detector for a fluid temperature of the upstream side of the orifice, and a control arithmetic circuit including a flow rate comparison circuit that calculates a fluid flow rate using a detection pressure and a detection temperature from each of the detectors and calculates a difference between the calculated flow rate and a setting flow rate.

Advantageous Effects of Invention

According to the present invention, it is possible to diagnose an abnormality of a fluid control device from an operation of an entire fluid supply line including a plurality of fluid control devices.

DESCRIPTION OF EMBODIMENTS

Hereinafter, an abnormality diagnosis method of a fluid supply line according to an embodiment of the present invention will be described.

Figure 1:
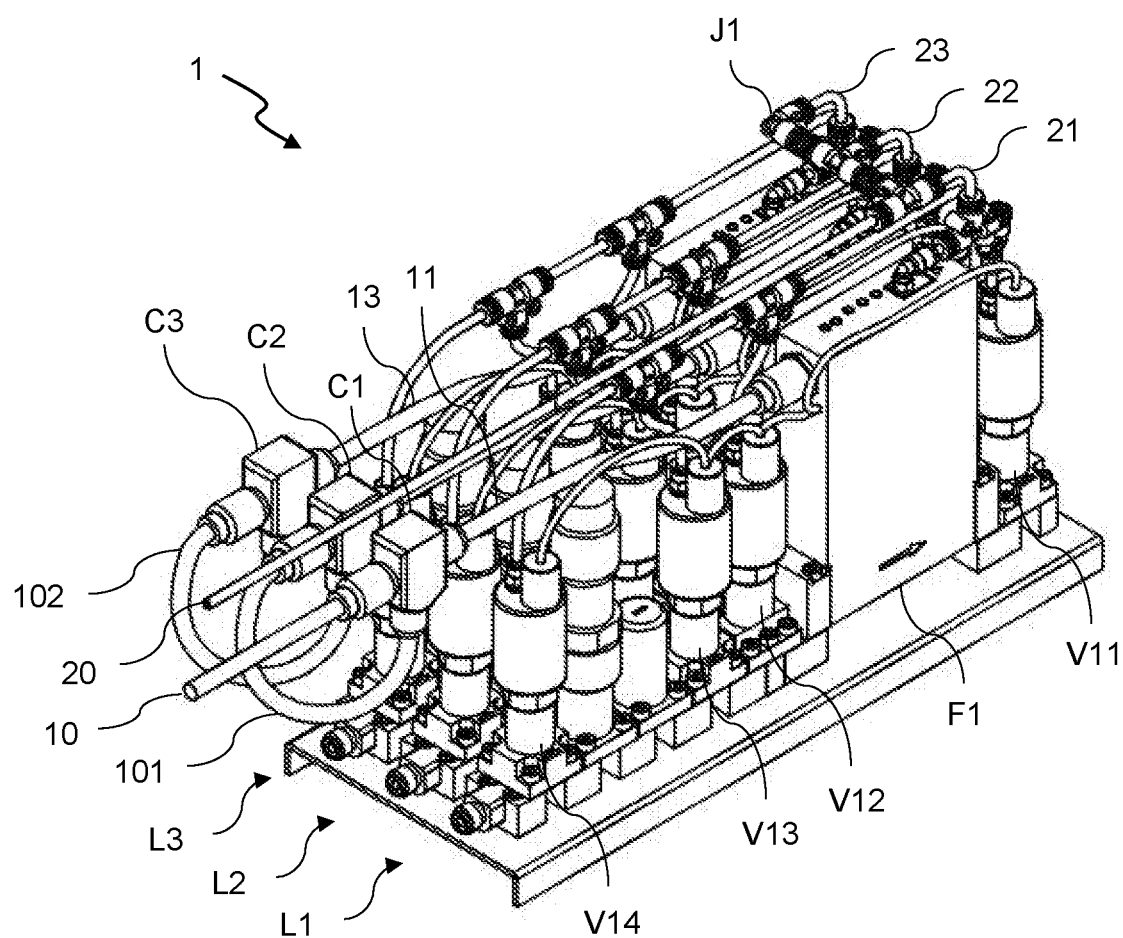
FIG. 1 is an external perspective view illustrating a gas unit including a plurality of fluid supply lines in an abnormality diagnosis method of a fluid supply line according to an embodiment of the present invention.
Figure 2:
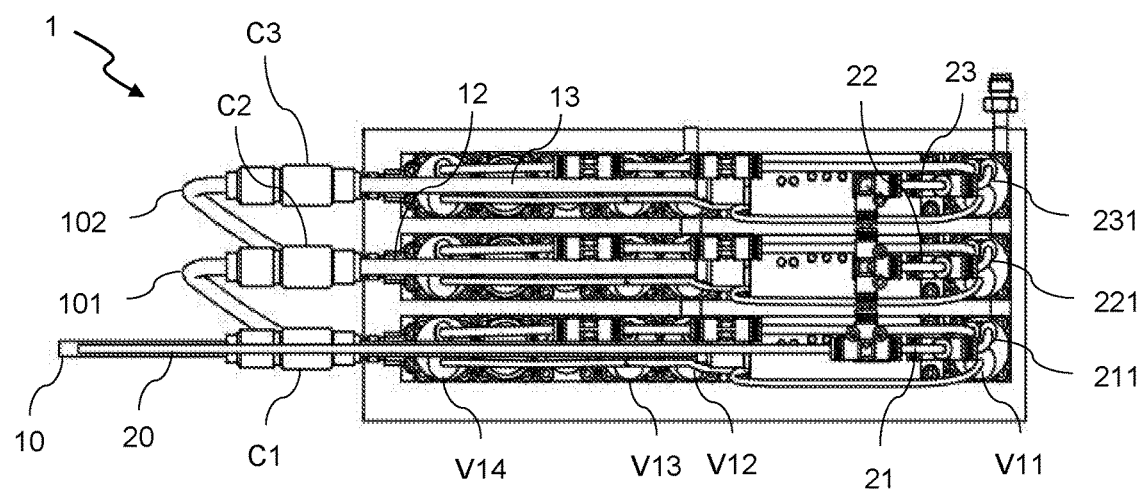
FIG. 2 is a plan view illustrating a gas unit including a plurality of fluid supply lines in an abnormality diagnosis method of a fluid supply line according to the present embodiment.
Figure 3:
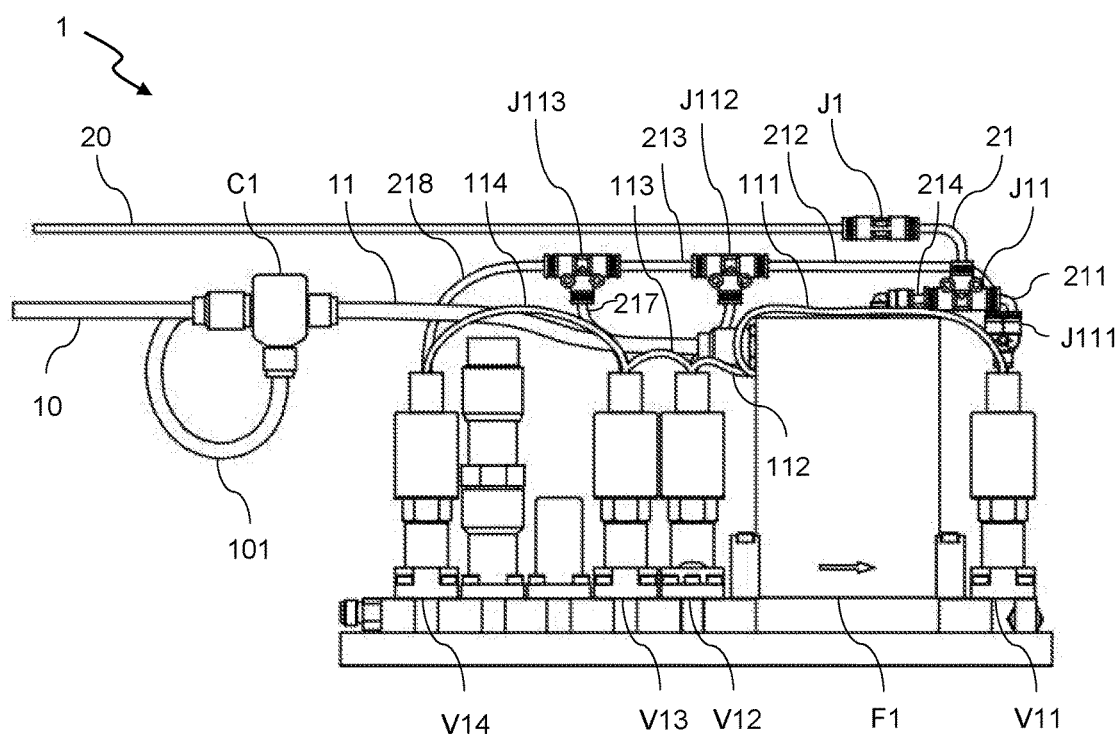
FIG. 3 is a side view illustrating a gas unit including a plurality of fluid supply lines in an abnormality diagnosis method of a fluid supply line according to the present embodiment.

First, a fluid supply line suitable for applying the abnormality diagnosis method of the fluid supply line according to the present embodiment will be described. A gas unit 1 illustrated in FIGS. 1 to 3 includes fluid supply lines L1, L2, and L3.

Here, the "fluid supply lines (L1, L2, and L3)" are one of constituent units of the gas unit (1), and include a path through which a process fluid circulates and a group of fluid control devices arranged on the path. The fluid supply lines (L1, L2, and L3) are minimum constituent units that can control the process fluid and independently process a processed object. The gas unit is normally configured by arranging a plurality of fluid supply lines in parallel. Further, "outside the line" mentioned in the following description is a portion or mechanism that does not configure the fluid supply line, and a mechanism outside the line includes a power supply source for supplying power required for driving the fluid supply line, a drive pressure supply source for supplying a drive pressure, a device configured to be able to communicate with the fluid supply line, and the like.

Each of the fluid supply lines L1, L2, and L3 causes a plurality of fluid control devices to communicate with each other fluid-tightly, and the fluid control devices include valves (V11 to V14, V21 to V24, and V31 to V34) and flow rate control devices (F1 to F3). In the following description, the valves (V11 to V14, V21 to V24, and V31 to V34) may be collectively referred to as the valve V, and the flow rate control devices (F1 to F3) may be collectively referred to as the flow rate control device F.

The flow rate control device F is a device that controls a flow rate of a fluid in each of the fluid supply lines LL L2, and L3.

The flow rate control device F can be configured by a flow rate range variable type flow rate control device, for example. The flow rate range variable type flow rate control device is a device that can automatically switch and select a flow rate control region by operating a switching valve.

The flow rate range variable type flow rate control device has, for example, a fluid passage for a small flow rate and a fluid passage for a large flow rate as a fluid passage to a flow rate detection unit of the flow rate control device. A fluid in a small flow rate region is circulated to the flow rate detection unit through the fluid passage for the small flow rate and a detection level of the flow rate control unit is switched to a detection level suitable for the detection of the flow rate of the small flow rate region, and a fluid in a large flow rate region is circulated to the flow rate detection unit through the fluid passage for the large flow rate and the detection level of the flow rate control unit is switched to a detection level suitable for the detection of the flow rate of the large flow rate region. As a result, the flow rate is controlled by switching the fluid in each of the large flow rate region and the small flow rate region.

Further, the flow rate range variable type flow rate control device is a pressure type flow rate control device in which a flow rate of a fluid circulating through an orifice is calculated as $Qc=KP_1$ (K is a proportional constant) or $Qc=KP_2{}^m(P_1-P_2)^n$ (K is a proportional constant and m and n are constants) by using an orifice upstream side pressure $P_1$ and/or an orifice downstream side pressure $P_2$. A fluid passage between the downstream side of a control valve of the pressure type flow rate control device and a fluid supply pipeline can be configured as at least two or more parallel fluid passages, and an orifice with a different fluid flow rate characteristic can be interposed in each parallel fluid passage. In this case, the fluid in the small flow rate region is circulated to one orifice for flow rate control of the fluid in the small flow rate region, and the fluid in the large flow rate region is circulated to at least the other orifice for flow rate control of the fluid in the large flow rate region.

Further, a range of the flow rate can be set in three stages. In this case, the orifices are set as three types of orifices including a large flow rate orifice, an intermediate flow rate orifice, and a small flow rate orifice. Further, a first switching valve, a second switching valve, and the large flow rate orifice are interposed in series in one fluid passage, the small flow rate orifice and the intermediate flow rate orifice are interposed in the other fluid passage, and a passage communicating between the two switching valves and a passage communicating between the small flow rate orifice and the intermediate flow rate orifice are caused to communicate with each other.

According to the flow rate range variable type flow rate control device, it is possible to maintain high control accuracy while expanding a flow rate control range.

Further, in another example, the flow rate control device F can be configured by a differential pressure type flow rate control device. The differential pressure type flow rate control device is a device that uses a flow rate calculation formula derived from Bernoulli's theorem as a basis and calculates and controls a fluid flow rate by adding various corrections thereto.

The differential pressure type flow rate control device has a control valve including a valve drive unit, an orifice provided on the downstream side of the control valve, a detector for a fluid pressure $P_1$ of the upstream side of the orifice, a detector for a fluid pressure $P_2$ of the downstream side of the orifice, and a detector for a fluid temperature T of the upstream side of the orifice. By using an incorporated control arithmetic circuit, a fluid flow rate Q is calculated by $Q=C_1 \cdot P_1/\sqrt{T} \cdot ((P_2/P_1)m-(P_2/P_1)n)^{1/2}$ (where $C_1$ is a proportional constant, and m and n are constants) using a detection pressure and a detection temperature from each detector, and a difference between the calculated flow rate and the setting flow rate is calculated.

According to the differential pressure type flow rate control device, it can be used in an in-line form without restrictions on a mounting posture. Further, a control flow rate is hardly affected by a variation in the pressure, and highly accurate flow rate measurement or flow rate control can be performed in real time.

The flow rate control device F includes an operation information acquisition mechanism that acquires operation information of the flow rate control device F, and an information processing module that collects operation information of the valves V forming the same line, monitors the valves V, and controls each valve V.

Processing that can be executed by the flow rate control device F will be described in detail later. The operation information acquisition mechanism can include, for example, various sensors incorporated in the flow rate control device F, arithmetic devices for performing the flow rate control, an information processing module for executing processing of information of the sensors and the arithmetic devices, and the like. Further, with respect to the valves V configuring the same fluid supply lines L1, L2, and L3, by supplying a drive pressure from a mechanism outside the line via the flow rate control device F or enabling communication, the operation information of each valve V can be collected in the flow rate control device F. As a result, operation information of the entire line is configured together with the operation information of each valve V and the operation information of the flow rate control device F.

The valve V is a valve used in a gas line of the fluid control apparatus, such as a diaphragm valve.

As the operation information acquisition mechanism for acquiring the operation information of the valve V, a pressure sensor, a temperature sensor, a limit switch, or a magnetic sensor is mounted to the valve V at a predetermined location. An information processing module for processing data detected by the pressure sensor, the temperature sensor, the limit switch, or the magnetic sensor is incorporated.

A mounting position of the operation information acquisition mechanism is not limited, and may be mounted outside the valve V on a drive pressure supply path or electric wiring in view of its function.

Here, the pressure sensor is configured by, for example, a pressure-sensitive element for detecting a pressure change in a predetermined space, a piezoelectric element for converting a detection value of a pressure detected by the pressure-sensitive element into an electric signal, and the like, and detects a pressure change in the sealed internal space.

Further, the temperature sensor is, for example, a sensor for measuring the temperature of the fluid. The temperature sensor is installed in the vicinity of the flow passage to measure the temperature of the corresponding location, so that the temperature of the installation location can be regarded as the temperature of the fluid circulating through the flow passage.

Further, the limit switch is fixed in the vicinity of a piston, for example, and the switch is switched according to a vertical movement of the piston. As a result, the number of times of opening/closing the valve V, the frequency of opening/closing thereof, the opening/closing speed thereof, and the like can be detected.

Further, the magnetic sensor can measure not only an opening/closing state but also an opening degree of the valve V by sensing a change in the distance from a magnet attached to a predetermined position.

Figure 4:
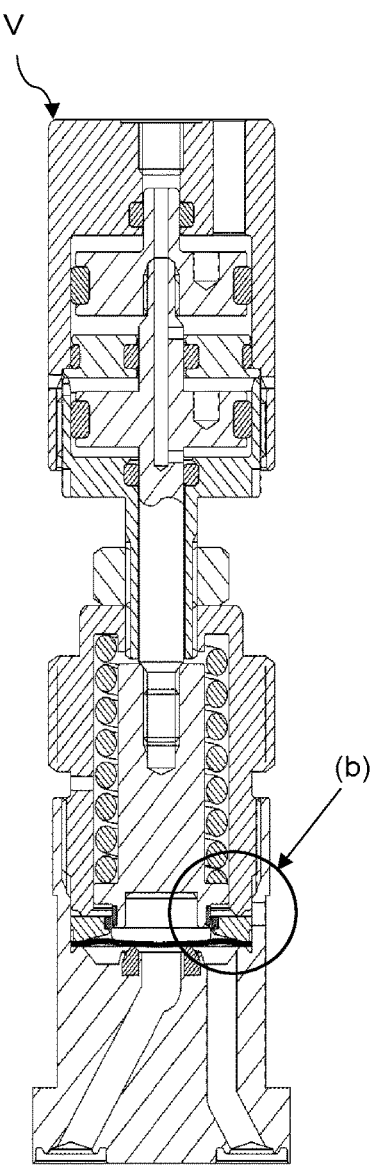
FIG. 4 is a cross-sectional view illustrating an internal structure of a valve configuring a fluid supply line to which an abnormality diagnosis method of a fluid supply line according to the present embodiment is applied, when a magnetic sensor is provided, in which (a) is an overall view and (b) is a partial enlarged view.
Figure 4:
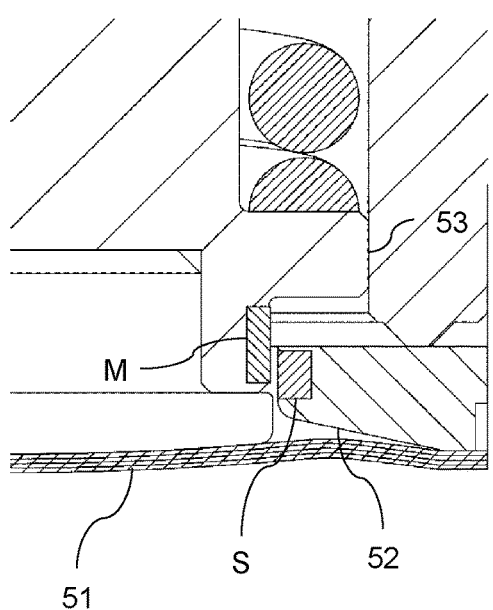

More specifically, as illustrated in an example of FIG. 4, a magnetic sensor S is attached to a surface facing a stem 53, inside of a pressing adapter 52 that presses a peripheral edge of a diaphragm 51. Further, a magnet M is attached in the vicinity of the pressing adapter 52 of the stem 53 that slides according to the opening/closing operation of the valve V.

Here, the magnetic sensor S has a planar coil, an oscillation circuit, and an integration circuit, and an oscillation frequency changes according to a change in the distance from the magnet M located at the facing position. In addition, by converting the frequency by the integration circuit and obtaining an integrated value, not only the opening/closing state of the valve V but also the opening degree at the time of opening the valve can be measured.

By configuring the valve V as described above, it is possible to perform the following operation abnormality diagnosis.

That is, the presence or absence of an abnormality can be determined according to whether or not a top surface or bottom surface position of the stem 53 at the time of abnormality diagnosis is a top surface or bottom surface position at the time of normality. That is, the top surface position and the bottom surface position when the stem 53 is operated are measured on the basis of a change in the distance between the magnetic sensor S and the magnet M. It is determined whether or not the top surface position and the bottom surface position are matched with the previously measured top surface position and bottom surface position at the time of normality. If they are matched, it can be determined that there is no abnormality, and if they are not matched, it can be determined that there is an abnormality.

Further, the presence or absence of the abnormality can be determined according to whether or not the stroke of the stem 53 at the time of abnormality diagnosis is matched with the stroke at the time of normality. That is, a movement distance (stroke) from the top surface position to the bottom surface position when the stem 53 is operated is measured on the basis of the change in the distance between the magnetic sensor S and the magnet M. It is determined whether or not the stroke is matched with the previously measured stroke at the time of normality. If they are matched, it can be determined that there is no abnormality, and if they are not matched, it can be determined that there is an abnormality.

Further, the presence or absence of the abnormality can be determined according to whether or not the operating speed of the stem 53 at the time of abnormality diagnosis is matched with the operating speed at the time of normality. That is, the operating speed at the time of operating the stem 53 is measured on the basis of a change in the distance between the magnetic sensor S and the magnet M. It is determined whether or not the operating speed is matched with the previously measured operating speed at the time of normality. If they are matched, it can be determined that there is no abnormality, and if they are not matched, it can be determined that there is an abnormality.

Thereby, the operation abnormality of the valve V can be diagnosed accurately and easily without complicating the fluid supply lines L1, L2, and L3.

The information acquired by the information acquisition mechanism in the valve V can be collected in the flow rate control devices F configuring the same fluid supply lines L1, L2, and L3, and can be transmitted to a predetermined information processing device provided outside the line together with the operation information of the flow rate control devices F.

The gas unit 1 is connected to a mechanism outside the line including a drive pressure supply source that supplies a drive pressure, a power supply source that supplies power, a communication device that performs communication, and the like.

Here, the fluid control device configuring the gas unit 1 is connected by a first connection mechanism that directly connects the mechanism outside the line and the predetermined fluid control device, and a second connection mechanism that branches from the first connection mechanism or uses the fluid control device connected by the first connection mechanism and connects the mechanism outside the line and another fluid control device. Specifically, in the case of the fluid supply line L1, in FIG. 5 which will be described in detail later, in the power supply from the outside of the line and the communication with the outside of the line, a main cable 10 and an extension cable 11 configure the first connection mechanism, and sub-cables 111, 112, 113, and 114 configure the second connection mechanism. Further, in FIG. 6 which will be described in detail later, in the supply of the drive pressure from the outside of the line, a main tube 20, an extension tube 21, and a sub-tube 214 configure the first connection mechanism, and extension tubes 211, 212, and 213 and sub-tubes 215, 216, 217, and 218 configure the second connection mechanism.

Figure 5:
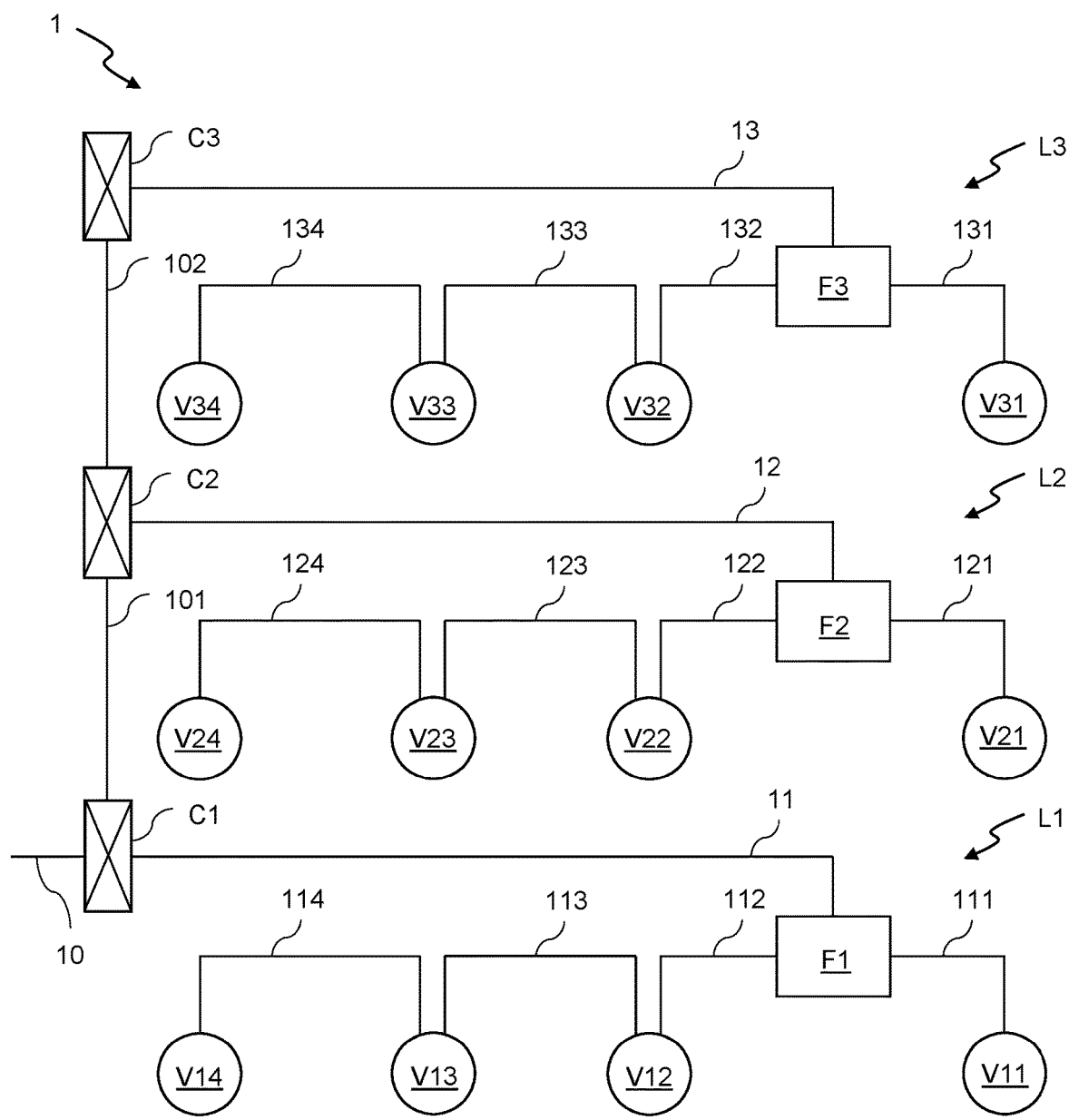
FIG. 5 is a schematic diagram illustrating a wiring structure of a cable in a gas unit including fluid supply lines to which an abnormality diagnosis method of a fluid supply line according to the present embodiment is applied.

As illustrated in FIG. 5, the power supply and the communication with the outside of the line are enabled by the main cable 10 that connects the mechanism outside the line and the gas unit 1.

The main cable 10 branches into an extension cable 11 and a branch cable 101 by a branch connector C1 provided in the vicinity of the gas unit, the branch cable 101 branches into an extension cable 12 and a branch cable 102 by a branch connector C2, and the branch cable 102 is connected to an extension cable 13 via a branch connector C3.

Looking at each of the fluid supply lines L1, L2, and L3, in the fluid supply line L1, the extension cable 11 is connected to the flow rate control device F1. The sub-cables 111 and 112 are led out from the flow rate control device F1 to which the extension cable 11 is connected, the sub-cable 111 is connected to the valve V11, and the sub-cable 112 is connected to the valve V12.

Further, the sub-cable 113 is led out from the valve V12 to which the sub-cable 112 is connected, and the sub-cable 113 is connected to the valve V13. Further, the sub-cable 114 is led out from the valve V13 to which the sub-cable 113 is connected, and the sub-cable 114 is connected to the valve V14.

The fluid supply line L2 is also connected to the mechanism outside the line by the same configuration as that of the fluid supply line L1.

That is, the extension cable 12 is connected to the flow rate control device F2. The sub-cables 121 and 122 are led out from the flow rate control device F2 to which the extension cable 12 is connected, the sub-cable 121 is connected to the valve V21, and the sub-cable 122 is connected to the valve V22.

In addition, the sub-cable 123 is led out from the valve V22 to which the sub-cable 122 is connected, and the sub-cable 123 is connected to the valve V23. Further, the sub-cable 124 is led out from the valve V23 to which the sub-cable 123 is connected, and the sub-cable 124 is connected to the valve V24.

The fluid supply line L3 is also connected to the mechanism outside the line by the same configuration as that of the fluid supply line L1.

That is, the extension cable 13 is connected to the flow rate control device F3. The sub-cables 131 and 132 are led out from the flow rate control device F3 to which the extension cable 13 is connected, the sub-cable 131 is connected to the valve V31, and the sub-cable 132 is connected to the valve V32.

In addition, the sub-cable 133 is led out from the valve V32 to which the sub-cable 132 is connected, and the sub-cable 133 is connected to the valve V33. Further, the sub-cable 134 is led out from the valve V33 to which the sub-cable 133 is connected, and the sub-cable 134 is connected to the valve V34.

Here, for the fluid supply line L1, the extension cable 11 is connected to the flow rate control device F1, and the sub-cables 111 and 112 are led out from the flow rate control device F1. However, in the flow rate control device F1, the extension cable 11 and the sub-cables 111 and 112 are connected. The connection can be made by using the information processing module provided in the flow rate control device F1 or branching the extension cable 11.

Even in the valves V12 and V13, the sub-cable 112 is connected to the sub-cable 113, and the sub-cable 113 is connected to the sub-cable 114. The connection of the sub-cables 112, 113, and 114 can also be made by using information processing modules provided in the valves V12 and V13 or branching the sub-cables 112 and 113.

For any connection, the mechanism outside the line and the valves V11, V12, V13, and V14 may be communicably connected via the flow rate control device F1 and power may be supplied.

The same is applied to connections in the other fluid supply lines L2 and L3, and the valves V21, V22, V23, and V24 are connected to the mechanism outside the line via the flow rate control device F2 by the main cable 10, the extension cable 12, and the sub-cables 121, 122, 123, and 124. Further, the valves V31, V32, V33, and V34 are connected to the mechanism outside the line via the flow rate control device F3 by the main cable 10, the extension cable 13, and the sub-cables 131, 132, 133, and 134.

Figure 6:
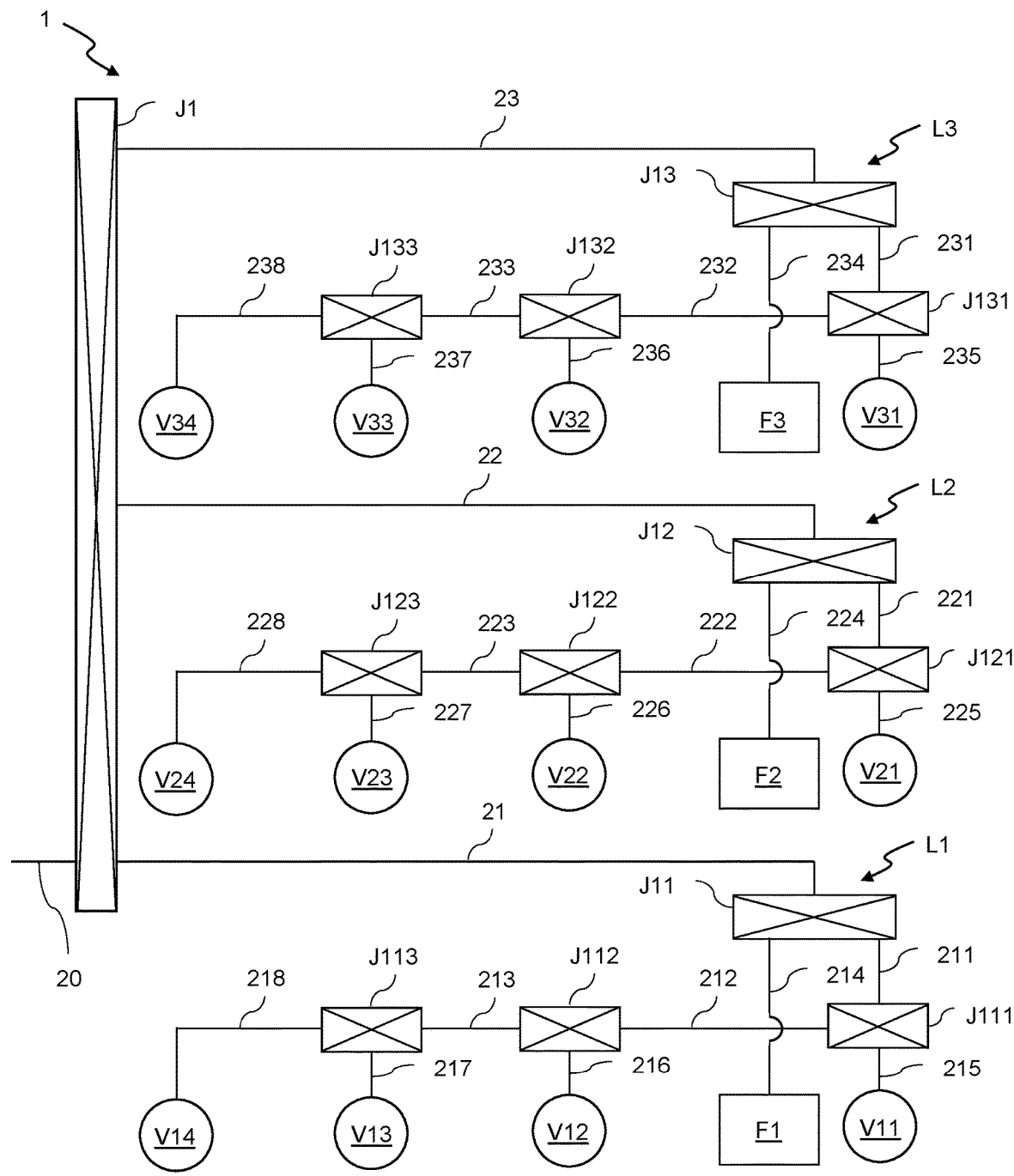
FIG. 6 is a schematic diagram illustrating a connection structure of a drive pressure supply path in a gas unit including fluid supply lines to which an abnormality diagnosis method of a fluid supply line according to the present embodiment is applied.

As illustrated in FIG. 6, the drive pressure is supplied from the mechanism outside the line to the gas unit 1 by the main tube 20.

The main tube 20 branches into extension tubes 21, 22, and 23 for respectively supplying the drive pressure to the fluid supply lines L1, L2, and L3 by a branch joint J1 provided in the vicinity of the gas unit 1.

Looking at each of the fluid supply lines L1, L2, and L3, in the fluid supply line L1, the extension tube 21 is branched into the extension tube 211 and the sub-tube 214 by a joint J11. The sub-tube 214 is connected to the flow rate control device F1, so that the drive pressure is supplied to the flow rate control device F1.

The extension tube 211 is further branched into the extension tube 212 and the sub-tube 215 by a joint J111. The sub-tube 215 is connected to the valve V11, so that the drive pressure is supplied to the valve V11.

Similarly, the extension tube 212 is further branched into the extension tube 213 and the sub-tube 216 by a joint J112. The sub-tube 216 is connected to the valve V12, so that the drive pressure is supplied to the valve V12.

Further, the extension tube 213 is further branched into a sub-tube 217 and a sub-tube 218 by a joint J113. The sub-tube 217 is connected to the valve V13, so that the drive pressure is supplied to the valve V13. Further, the sub-tube 218 is connected to the valve V14, so that the drive pressure is supplied to the valve V14.

The drive pressure is also supplied to the fluid supply line L2 by the same configuration as that of the fluid supply line L1.

That is, the extension tube 22 is branched into an extension tube 221 and a sub-tube 224 by a joint J12. The sub-tube 224 is connected to the flow rate control device F2, so that the drive pressure is supplied to the flow rate control device F2.

The extension tube 221 is further branched into an extension tube 222 and a sub-tube 225 by a joint J121. The sub-tube 225 is connected to the valve V21, so that the drive pressure is supplied to the valve V21.

Similarly, the extension tube 222 is further branched into an extension tube 223 and a sub-tube 226 by a joint J122. The sub-tube 226 is connected to the valve V22, so that the drive pressure is supplied to the valve V22.

Further, the extension tube 223 is further branched into a sub-tube 227 and a sub-tube 228 by a joint J123. The sub-tube 227 is connected to the valve V23, so that the drive pressure is supplied to the valve V23. Further, the sub-tube 228 is connected to the valve V24, so that the drive pressure is supplied to the valve V24.

The drive pressure is also supplied to the fluid supply line L3 by the same configuration as that of the fluid supply line L1.

That is, the extension tube 23 is branched into an extension tube 231 and a sub-tube 234 by a joint J13. The sub-tube 234 is connected to the flow rate control device F3, so that the drive pressure is supplied to the flow rate control device F3.

The extension tube 231 is further branched into an extension tube 232 and a sub-tube 235 by a joint J131. The sub-tube 235 is connected to the valve V31, so that the drive pressure is supplied to the valve V31.

Similarly, the extension tube 232 is further branched into an extension tube 233 and a sub-tube 236 by a joint J132. The sub-tube 236 is connected to the valve V32, so that the drive pressure is supplied to the valve V32.

Further, the extension tube 233 is further branched into a sub-tube 237 and a sub-tube 238 by a joint J133. The sub-tube 237 is connected to the valve V33, so that the drive pressure is supplied to the valve V33. Further, the sub-tube 238 is connected to the valve V34, so that the drive pressure is supplied to the valve V34.

Figure 7:
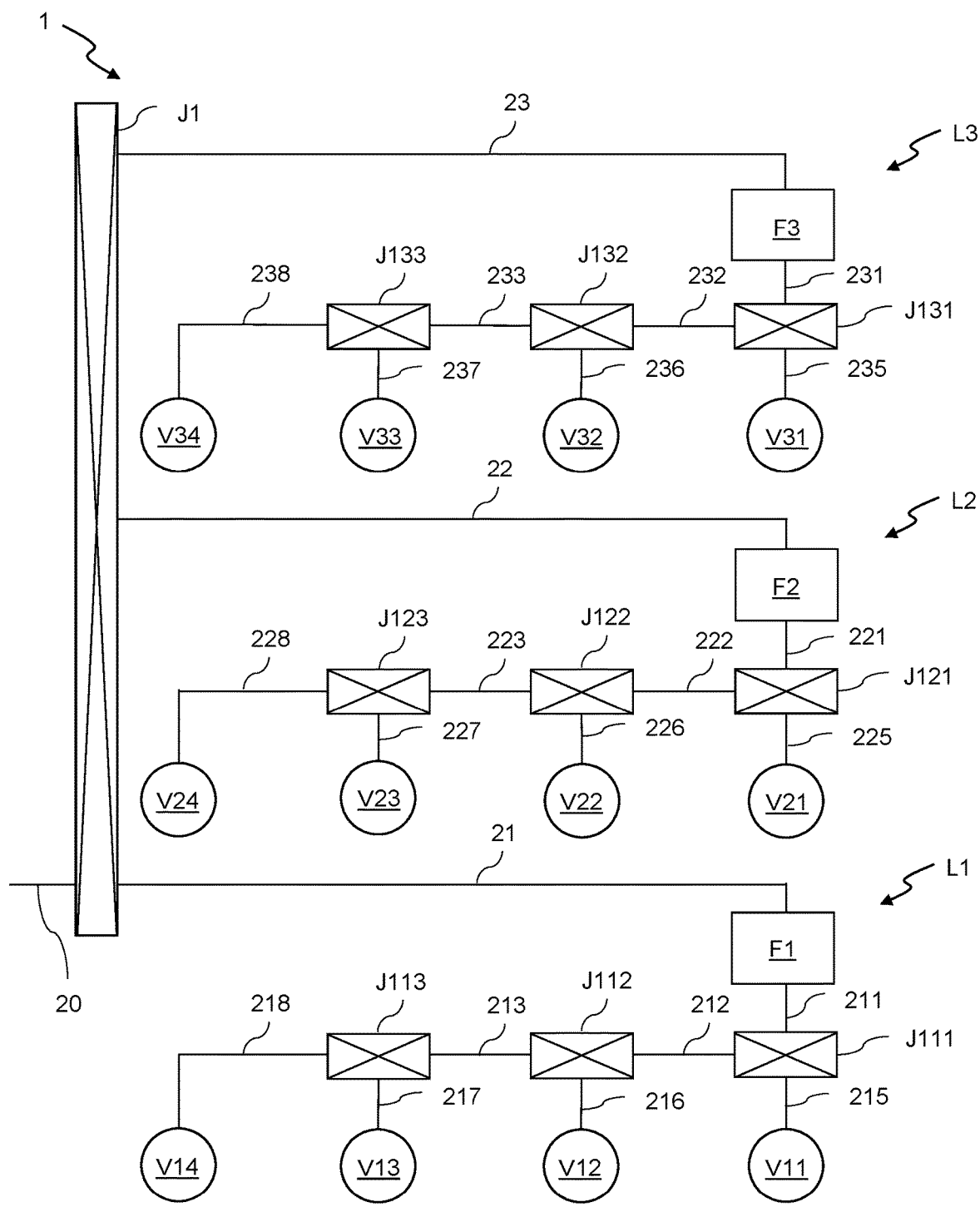
FIG. 7 is a schematic diagram illustrating a connection structure of a drive pressure supply path in a gas unit including fluid supply lines to which an abnormality diagnosis method of a fluid supply line according to a modification of the present embodiment is applied.

Here, for the fluid supply line L1, the flow rate control device F1 and the valves V11, V12, V13, and V14 are connected to the extension tube 21 and the main tube 20 in front of the extension tube 21 via the joints J11, J111, J112, and J113, the extension tubes 211, 212, and 213, and the sub-tubes 214, 215, 216, 217, and 218. However, the present invention is not limited thereto. As illustrated in FIG. 7, after connecting the extension tube 21 and the flow rate control device F1, the drive pressure can be supplied from the flow rate control device F1 to each of the valves V11, V12, V13, and V14. In this case, a mechanism for distributing the drive pressure supplied from the main tube 20 to the valves V11, V12, V13, and V14 may be provided in the flow rate control device F1, or the main tube drawn into the flow rate control device F1 may be branched in the flow rate control device F1.

The same can be applied to the fluid supply lines L2 and L3.

According to the configurations of the fluid supply lines L1, L2, and L3, the cable for performing the power supply or the communication is simplified, noise can be reduced, and delay in the transmission speed of the instruction signal can be suppressed. Further, since the inner volume of the tube supplying the drive pressure can be reduced, the opening/closing speed of each fluid control device such as the valve V and the flow rate control device F can be maintained, and an error can be prevented from occurring in the opening/closing speed of each fluid control device. As a result, it is possible to improve control accuracy of the fluid supply lines L1, L2, and L3 by suppressing a variation in the operation of each of the fluid control devices.

Figure 8:
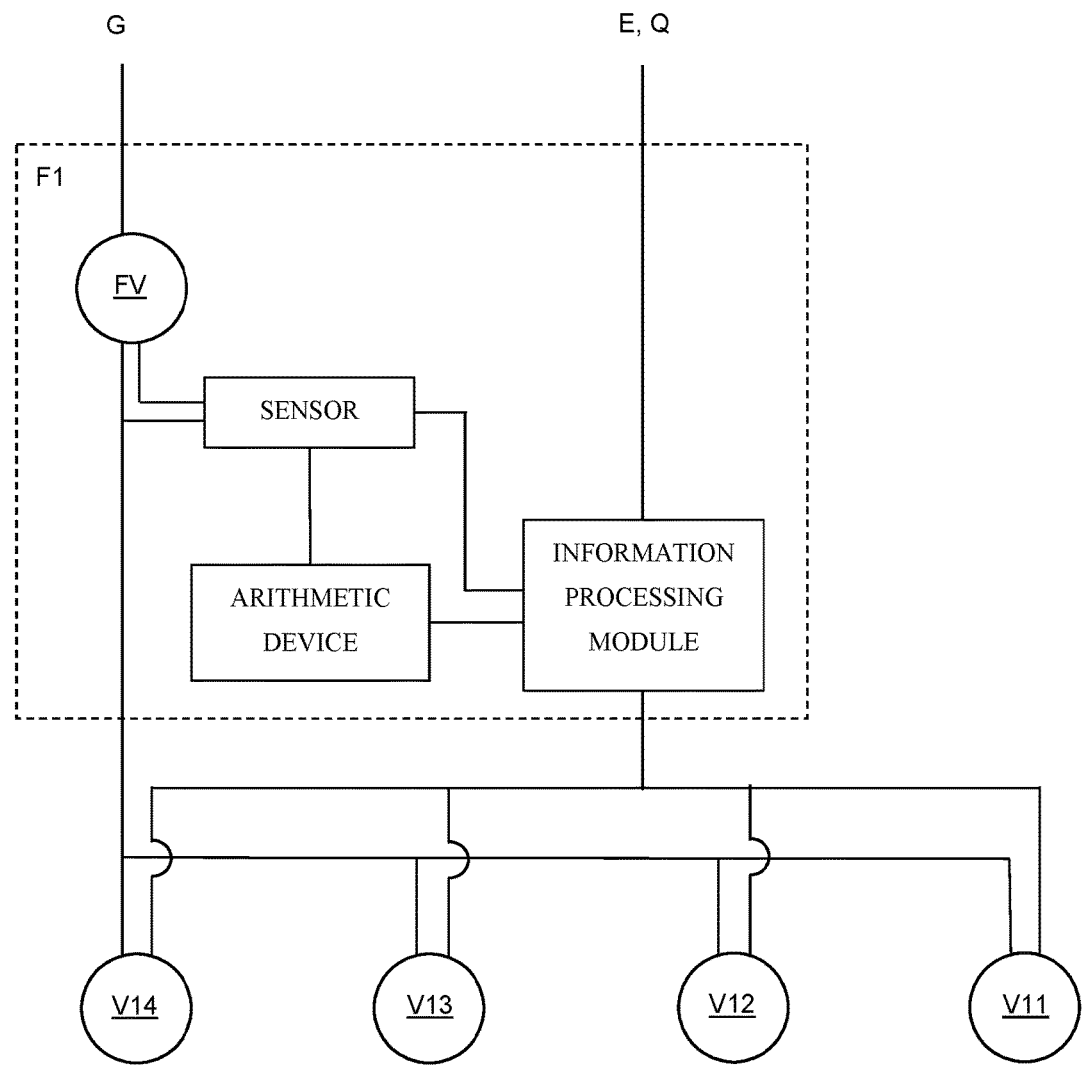
FIG. 8 is a configuration diagram schematically illustrating an internal configuration of a flow rate control device configuring a fluid supply line to which an abnormality diagnosis method of a fluid supply line according to the present embodiment is applied.

Further, in the fluid supply lines L1, L2, and L3, the flow rate control device F can be configured as illustrated in FIG. 8, for example. FIG. 8 illustrates a structure of the flow rate control device F1 configuring the fluid supply line L1. The same is applied to the flow rate control devices F2 and F3 configuring the other fluid supply lines L2 and L3.

In this example, in the fluid supply line L1, a daisy chain with the flow rate control device F1 as a master and the plurality of valves V11, V12, V13, and V14 as slaves is formed. In this case, by using a state of the daisy chain, it is possible to construct a system that analyzes the operation by regarding not only the individual valves V and the flow rate control device F but also the entire line as one device.

First, if a configuration in the flow rate control device F1 is mentioned, the sensor configures an operation information acquisition mechanism that acquires operation information of the flow rate control device F1. As described above, the sensor is configured by using the pressure sensor, the temperature sensor, or the magnetic sensor singly or in combination. Moreover, the arithmetic device is a device that controls the flow rate of the flow rate control device F1. Further, a valve FV in the flow rate control device receives the drive pressure from a drive pressure supply source G and supplies the drive pressure to the valves V11, V12, V13, and V14.

The information processing module is connected to the sensor or the arithmetic device, collects operation information of the flow rate control device F1, and executes predetermined information processing on the collected operation information. Further, the information processing module is communicably connected to the valves V11, V12, V13, and V14 configuring the fluid supply line L1, can collect the operation information of each of the valves V11, V12, V13, and V14, and can control each of the valves V11, V12, V13, and V14 by actively issuing a predetermined instruction signal.

When the flow rate control device F1 is configured as described above, each of the valves V11, V12, V13, and V14 configuring the same line can be individually identified to diagnose the presence or absence of an abnormality or analyze the operation of each of the valves V11, V12, V13, and V14 viewed from the entire line.

Specifically, in diagnosis of each of the valves V11, V12, V13, and V14 by the flow rate control device F1, for example, pressure measurement mechanisms are provided on the upstream and the downstream of the flow rate control device F1 or each valve V, opening/closing of each valve V is appropriately controlled, and a pressure at a predetermined position is measured. From a measurement value of the pressure, a pressure that should not be detected if the predetermined valve V is closed is detected, or a pressure that should be detected if the predetermined valve V is opened cannot be detected, so that an abnormality of the valve V can be diagnosed. Further, pressure drop characteristics at the predetermined position according to switching of the opening/closing state of the valve V are compared with pressure drop characteristics in a normal state, so that a failure of the valve V such as a seat leakage can be diagnosed. A measurement value obtained by each pressure measurement mechanism may be collected in the information processing module of the flow rate control device F.

In addition to diagnosing the presence or absence of an abnormality or analyzing the operation in the flow rate control device F, the operation information of each of the fluid supply lines L1, L2, and L3 collected in the flow rate control device F can be transmitted to an external information processing device via the main cable 10 to diagnose the presence or absence of the abnormality or analyze the operation in the information processing device. Even in this configuration, the operation of each of the fluid supply lines L1, L2, and L3 can be analyzed on the basis of the operation information acquired from the gas unit 1. The external information processing device may configure a part of the mechanism outside the line, or may be a device connected to be communicable with the mechanism outside the line. Further, the external information processing device can be configured by a so-called server computer or the like.

As a result, in the gas unit 1 in which a large number of fluid control devices are densely integrated, it is possible to individually identify the valve V and diagnose an operation state thereof, without removing the valve V from the line. Further, since each valve V is connected to the mechanism outside the line via the flow rate control device F for each of the fluid supply lines L1, L2, and L3, the flow rate control device F equipped with a plurality of valves V or the information processing device configured to be able to communicate with the flow rate control device F can monitor an operation state of each valve V on the basis of the operation of the plurality of valves V as a whole. As a result, it is possible not only to analyze the operation information for each valve V or flow rate control device F, but also to precisely monitor the entire line.

The reason why the analysis of the operation of the entire line contributes to the precise monitoring of the fluid supply lines L1, L2, and L3 is as follow. For example, for the plurality of valves V11, V12, V13, and V14 configuring the fluid supply line L1, even when the opening/closing operation is executed in some valves V13 and V14 and the opening/closing operation is not executed in the remaining valves V11 and V12, the valves V11 and V12 are affected by the opening/closing operation by the valves V13 and V14.

By referring to the operation information of the entire fluid supply line L1, the flow rate control device F1 connected to the valves V11, V12, V13, and V14 can grasp that the valves V11 and V12 do not execute the opening/closing operation, while the valves V13 and V14 execute the opening/closing operation, in a certain time zone, and the flow rate control device F1 can precisely analyze the states of the valves V11 and V12, which cannot be grasped by the independent operation of the valves V11 and V12.

Further, an analysis result of the operation information of the entire line can be used to determine the presence or absence of an abnormality of the fluid supply lines L1, L2, and L3 or predict the abnormality by performing data mining, for example. Specifically, an operation time of the valve V or the flow rate control device F in the entire line, the number of times of actually performing the opening/closing operation by the predetermined valve V, and a time affected by the opening/closing operations of other valves V can be grasped. Therefore, it is possible to determine timing of maintenance or part replacement on the basis of the operation time of the entire line, or to detect the abnormality by comparing the opening/closing speed of each valve V on the same line.

Figure 9:
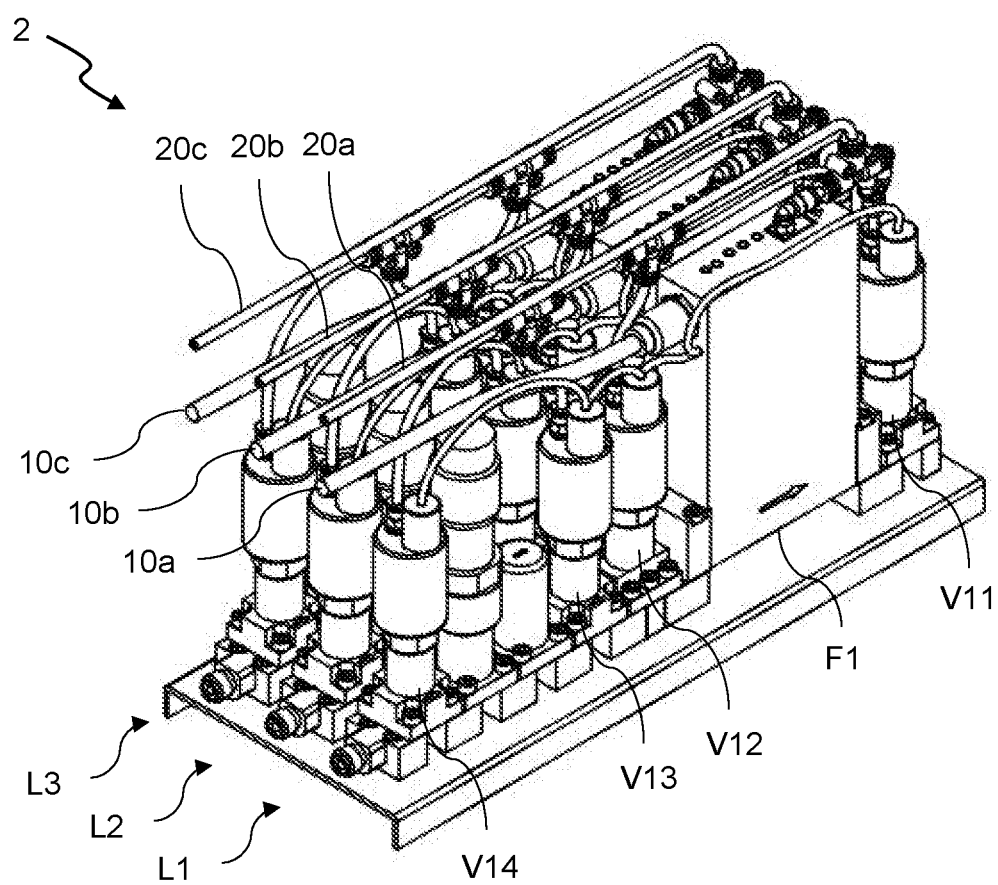
FIG. 9 is an external perspective view illustrating a gas unit of another form including fluid supply lines to which an abnormality diagnosis method of a fluid supply line according to the present embodiment is applied.
Figure 10:
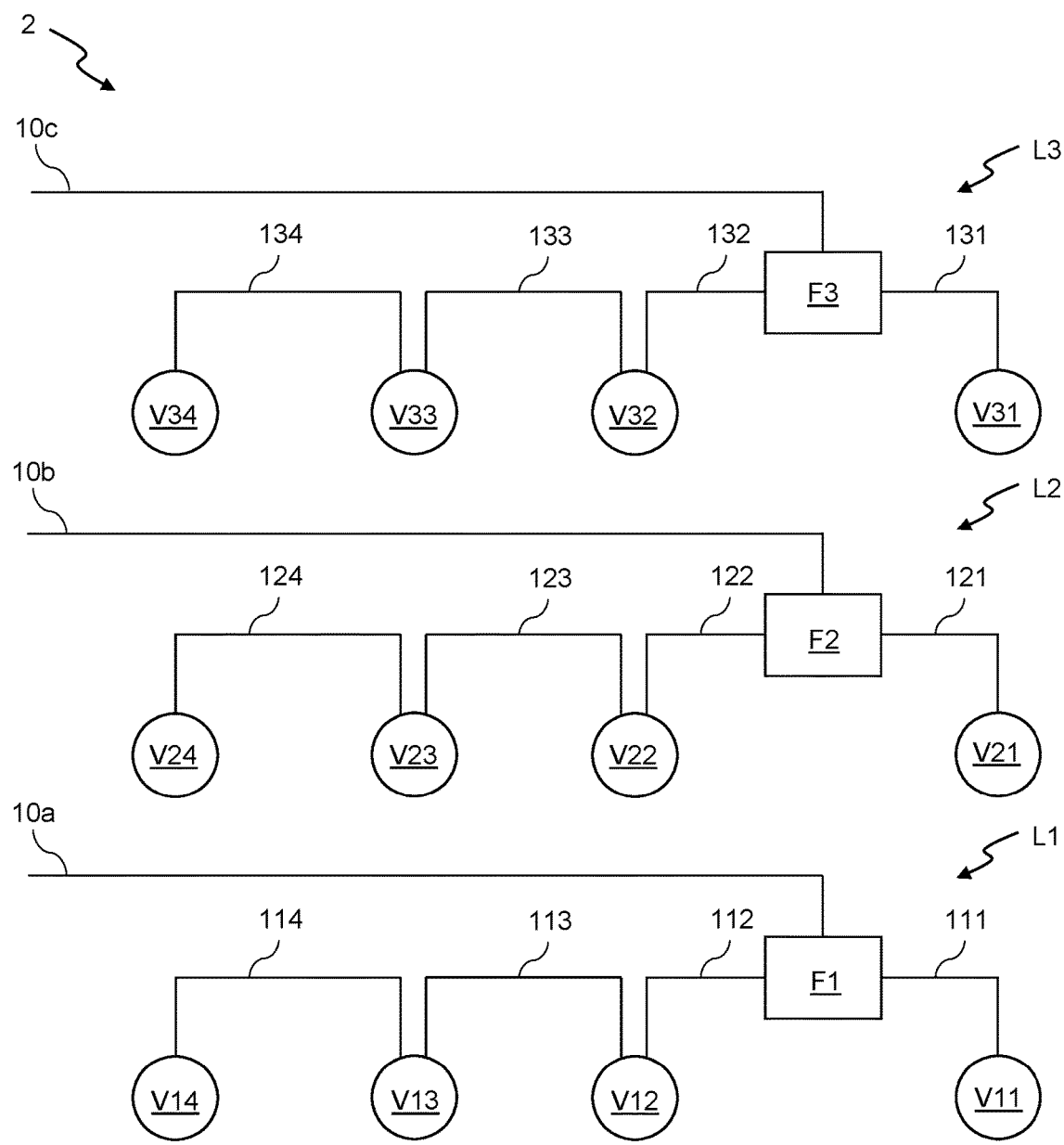
FIG. 10 is a schematic diagram illustrating a wiring structure of a cable in a gas unit of another form including fluid supply lines to which an abnormality diagnosis method of a fluid supply line according to the present embodiment is applied.
Figure 11:
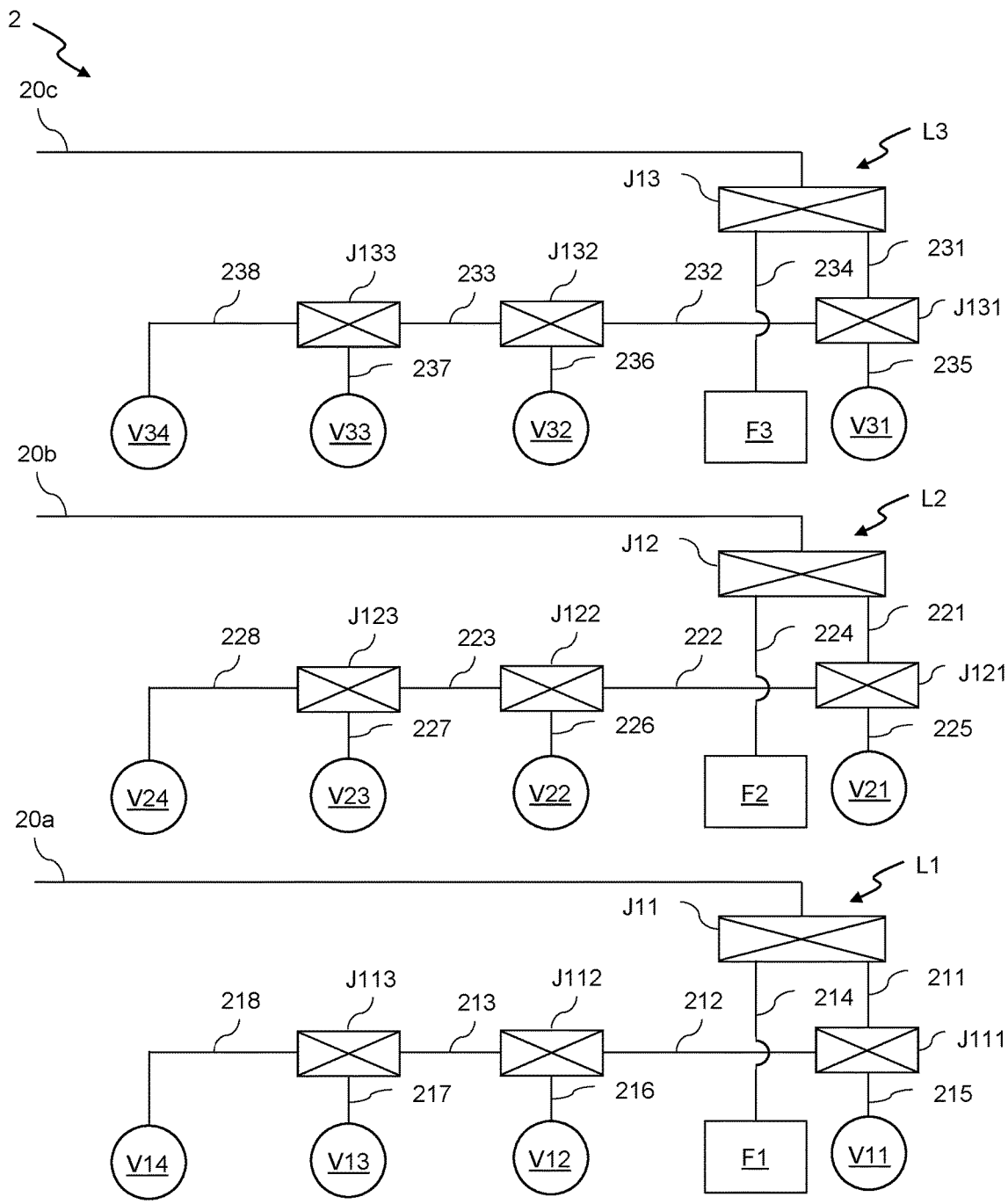
FIG. 11 is a schematic diagram illustrating a connection structure of a drive pressure supply path in a gas unit of another form including fluid supply lines to which an abnormality diagnosis method of a fluid supply line according to the present embodiment is applied.

The fluid supply lines L1, L2, and L3 described above can also configure a gas unit 2 illustrated in FIGS. 9 to 11.

Unlike the gas unit 1, the fluid supply lines L1, L2, and L3 configuring the gas unit 2 are individually connected to the mechanism outside the line.

That is, as illustrated in FIG. 10, power supply to the gas unit 2 and communication between the gas unit 2 and the outside of the line can be performed by a main cable 10a connecting the mechanism outside the line and the fluid supply line L1, a main cable 10b connecting the mechanism outside the line and the fluid supply line L2, and a main cable 10c connecting the mechanism outside the line and the fluid supply line L3.

In each of the fluid supply lines L1, L2, and L3, connection from the flow rate control device F to the valve V is the same as that of the gas unit 1.

Further, as illustrated in FIG. 11, the drive pressure is supplied from the mechanism outside the line to the gas unit 2 by main tubes 20a, 20b, and 20c for the fluid supply lines L1, L2, and L3.

In each of the fluid supply lines L1, L2, and L3, connections from the joints J11, J12, and J13 to the flow rate control device F or the valve V are the same as those of the gas unit 1.

Figure 12:
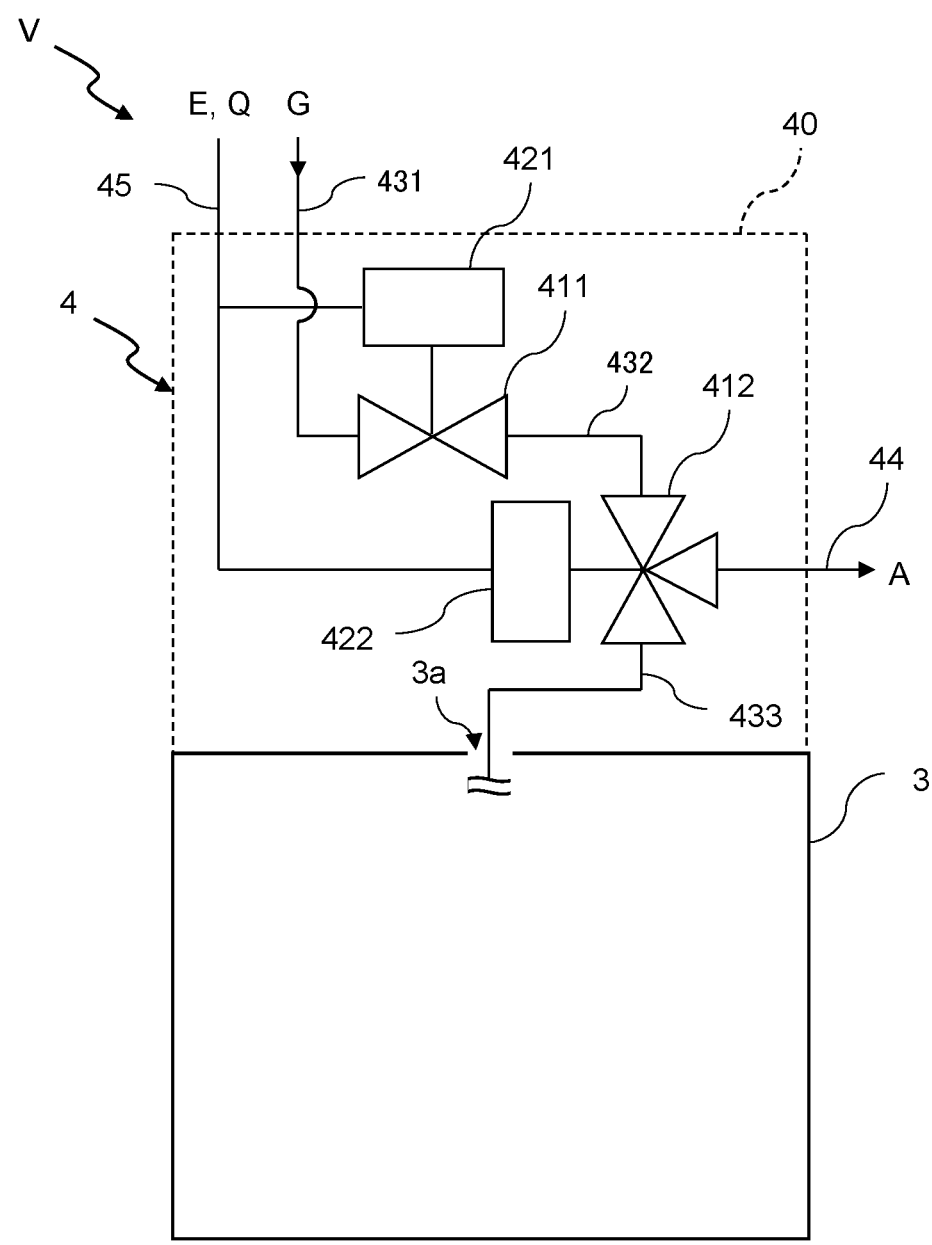
FIG. 12 is a schematic diagram illustrating an internal structure of a valve suitably used in a fluid supply line to which an abnormality diagnosis method of a fluid supply line according to the present embodiment is applied.

FIG. 12 is a schematic diagram illustrating an internal structure of the valve V suitably used in the fluid supply lines L1, L2, and L3 according to the above-described embodiment.

The valve V includes a valve body 3 and a drive pressure control device 4 connected to the valve body 3.

The valve body 3 is a valve used in the gas line of the fluid control apparatus, such as a diaphragm valve, and includes at least a drive pressure introduction port 3a for introducing the drive pressure supplied from the outside to the inside.

The drive pressure control device 4 is connected to the drive pressure introduction port 3a of the valve body 3, and supplies the drive pressure supplied from a drive pressure supply source G outside the line to the valve body 3.

The drive pressure control device 4 includes drive pressure introduction paths 431, 432, and 433 as introduction paths for introducing the drive pressure from the drive pressure supply source G outside the line to the valve body 3. The drive pressure introduction path 431 is connected to the drive pressure supply source G outside the line. The drive pressure introduction path 432 connects the drive pressure introduction path 431 and the drive pressure introduction path 433 via an automatic valve 411 and an automatic valve 412. The drive pressure introduction path 433 is connected to the drive pressure introduction port 3a of the valve body 3.

Further, the drive pressure control device 4 is provided with a normally closed (N.C.) automatic valve 411 that opens and closes the drive pressure introduction path 431, and a normally opened (N.O.) automatic valve 412 that opens and closes the drive pressure introduction path 433 in conjunction with the automatic valve 411 and opens and closes an exhaust passage 44 for exhausting the drive pressure from the drive pressure introduction path 433 to the outside A of the device.

The automatic valves 411 and 412 are opened and closed by valve drive units 421 and 422, respectively. The valve drive units 421 and 422 receive power and an instruction signal for instructing an operation from a power supply source E and an instruction signal transmission source Q via wiring 45, and execute an operation based on the instruction signal.

Both the automatic valves 411 and 412 can be configured by various valves such as a normal solenoid valve, an air-operated solenoid valve, or an electric valve.

In the drive pressure control device 4, the automatic valves 411 and 412, the valve drive units 421 and 422, the drive pressure introduction paths 431, 432, and 433, and the like are covered with a hollow cap-shaped casing 40, and the valve body 3 is covered with the casing 40 so as to be integrated with the valve body 3.

The valve body 3 and the casing 40 can be appropriately integrated by a mechanism such as screwing or bonding with an adhesive.

In the drive pressure control device 4 having the above configuration, regardless of the opening/closing state of the automatic valves 411 and 412, the drive pressure supplied from the drive pressure supply source G outside the line is always supplied to a place of the automatic valve 411 via the drive pressure introduction path 431.

The opening/closing operation of the drive pressure control device 4 will be described. First, when the automatic valve 411 is opened by the valve drive unit 421, the drive pressure supplied to the automatic valve 411 is led to the automatic valve 412 via the drive pressure introduction path 432. Further, the automatic valve 412 is interlocked with the automatic valve 411, and is closed when the automatic valve 411 is opened, the exhaust passage 44 is closed, and the drive pressure is supplied to the valve body 3 via the drive pressure introduction path 433.

On the other hand, when the automatic valve 411 is closed by the valve drive unit 421, the drive pressure supplied from the drive pressure supply source G is blocked by the automatic valve 411. Further, the automatic valve 412 interlocked with the automatic valve 411 is opened, the exhaust passage 44 is opened, and the drive pressure in the valve body 3 is exhausted.

According to the valve V, since the drive pressure control device 4 and the valve body 3 are integrally connected, the wiring connected to the valve V can be simplified.

Further, the drive pressure is always supplied to a place of the automatic valve 411 of the drive pressure control device 4 integrally connected to the valve body 3, and a state where the drive pressure is increased to a constant pressure in a place close to the drive pressure introduction port 3a of the valve body 3 is maintained. As a result, the valve body 3 is less susceptible to a change in the drive pressure at the time of opening/closing, the opening/closing speed can be maintained constantly, and accuracy of controlling material gas can be improved.

Although the valve V described above has the structure in which the drive pressure control device 4 is connected to the valve body 3, the present invention is not limited thereto. A space for incorporating the drive pressure control device 4 is secured in the valve body 3, so that the drive pressure control device 4 can be incorporated in the space.

In the above-described embodiment, each of the gas units 1 and 2 is configured by the three fluid supply lines L1, L2, and L3. However, an application of the present invention is not limited by the number of lines.

Figure 13:
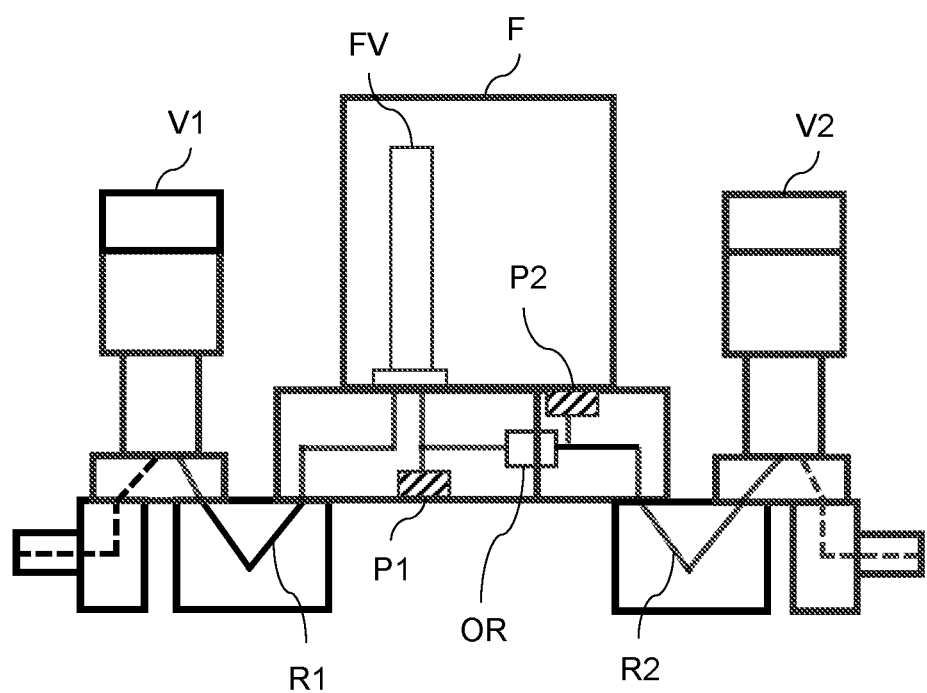
FIG. 13 is a schematic diagram illustrating steps of an abnormality diagnosis method of a fluid supply line according to the present embodiment

Next, a flow of detecting an abnormality by applying the abnormality diagnosis method of the fluid supply line according to the present embodiment to the fluid supply lines L1, L2, and L3 having the above configuration will be described with reference to FIG. 13.

In the following description and FIG. 13, the fluid supply lines L1, L2, and L3 are referred to as the fluid supply line L, and the flow rate control devices F1, F2, and F3 are referred to as the flow rate control device F. Further, the valve V1 is disposed on the upstream of the flow rate control device F and the valve V2 is disposed on the downstream. However, the valves V1 and V2 correspond to the valves V12 and V11 in the above-described fluid supply line L1.

As described above, the fluid supply line L includes the flow rate control device F, the valve V1 disposed on the upstream side of the flow rate control device F, and the valve V2 disposed on the downstream side of the flow rate control device F. Further, the flow rate control device F is connected to the mechanism outside the fluid supply line L by the first connection mechanism, and the flow rate control device F is provided with a valve FV in the flow rate control device and pressure detection mechanisms P1 and P2 such as pressure sensors for detecting the pressure in the flow passage. The pressure detection mechanisms P1 and P2 are respectively provided on the downstream side and the upstream side with an orifice OR provided in the flow rate control device F interposed therebetween.

Further, the valve V1 is connected to the mechanism outside the fluid supply line L by the second connection mechanism branched from the first connection mechanism, and the valve V2 is connected to the mechanism outside the fluid supply line L by the second connection mechanism branched from the first connection mechanism.

Here, the abnormality diagnosis method of the fluid supply line according to the present embodiment diagnoses an abnormality of the valve FV in the flow rate control device, the valve V1, and the valve V2, and includes a valve operation step, a pressure adjustment step, a pressure detection step, and an abnormality determination step.

The valve operation step is a step of opening/closing any one or more of the valve FV in the flow rate control device, the valve V1, and the valve V2.

The pressure adjustment step is a step of setting a part or all of flow passages R1 and R2 leading from the valve portion of the valve V1 to the valve V2 via the flow passage of the flow rate control device F to a vacuum state or a pressurization state. The flow passage R1 is a flow passage leading from the valve portion of the valve V1 to the valve portion of the valve FV in the flow rate control device, and the flow passage R2 is a flow passage leading from the valve portion of the valve FV in the flow rate control device to the valve portion of the valve V2. Further, with regard to the vacuum state or the pressurization state, the abnormality diagnosis is performed by generating a differential pressure between the upstream side and the downstream side of the valve portions of the valve FV in the flow rate control device and the valves V1 and V2 performing the diagnosis, and detecting a pressure increase or decrease. Therefore, a method for providing the differential pressure can be based on either the vacuum state or the pressurization state.

The pressure detection step is a step of acquiring temporal pressure characteristics of a part or all of the flow passages R1 and R2 leading from the valve portion of the valve V1 to the valve V2 via the flow passage of the flow rate control device F, by the pressure detection mechanisms P1 and P2.

The abnormality determination step is a step of comparing pressure characteristics acquired by the pressure detection mechanisms P1 and P2 and pressure characteristics at the time of normality measured in advance under the same conditions and determining the presence or absence of an abnormality.

<Seat Leakage Abnormality Diagnosis of Valve FV in Flow Rate Control Device>

In the case of diagnosing a seat leakage abnormality of the valve FV in the flow rate control device, the following steps are sequentially executed.

First step (valve operation step): the valve V1 is opened.

Second step (valve operation step): the valve FV in the flow rate control device is closed.

Third step (valve operation step): the valve V2 is opened.

Fourth step (pressure adjustment step): the inside of the flow passage R2 leading from the valve portion of the valve FV in the flow rate control device to the valve portion of the valve V2 is evacuated by performing evacuation from the side of the valve V2.

Fifth step (valve operation step): when the inside of the flow passage R2 is evacuated, the valve V2 is closed.

Sixth step (pressure detection step): the temporal pressure characteristics in the flow passage R2 are acquired by the pressure detection mechanisms P1 and P2.

Seventh step (abnormality determination step): the pressure characteristics in the flow passage R2 acquired by the pressure detection mechanisms P1 and P2 and the pressure characteristics at the time of normality measured in advance under the same conditions are compared and the presence or absence of an abnormality is determined.

Since the valve FV in the flow rate control device and the valve V2 are closed, the inside of the flow passage R2 maintains a vacuum state in the normal case. On the contrary, when the pressure in the flow passage R2 gradually increases, it is assumed that the fluid leaks from the flow passage R1 into the flow passage R2, and it is diagnosed that an abnormality occurs in the valve FV in the flow rate control device.

Since the above diagnosis is based on the assumption that no leak occurs in the valve V2 and the valve V1, it is preferable to perform the abnormality diagnosis for each of the valve V2 and the valve V1.

<Seat Leakage Abnormality Diagnosis of Valve V1>

First step (valve operation step): the valve V1 is closed.

Second step (valve operation step): the valve FV in the flow rate control device is opened.

Third step (valve operation step): the valve V2 is opened.

Fourth step (pressure adjustment step): the inside of the flow passages R1 and R2 leading from the valve portion of the valve V1 to the valve portion of the valve V2 via the flow passage of the flow rate control device F is evacuated by performing evacuation from the side of the valve V2.

Fifth step (valve operation step): when the inside of the flow passages R1 and R2 is evacuated, the valve V2 is closed.

Sixth step (pressure detection step): the temporal pressure characteristics in the flow passages R1 and R2 are acquired by the pressure detection mechanisms P1 and P2.

Seventh step (abnormality determination step): the pressure characteristics in the flow passages R1 and R2 acquired by the pressure detection mechanisms P1 and P2 and the pressure characteristics at the time of normality measured in advance under the same conditions are compared and the presence or absence of an abnormality is determined.

Since the valve V1 and the valve V2 are closed, the inside of the flow passages R1 and R2 maintains a vacuum state in the normal case. On the contrary, when the pressure in the flow passages R1 and R2 gradually increases, it is assumed that the fluid leaks from the side of the valve V1 into the flow passages R1 and R2, and it is diagnosed that an abnormality occurs in the valve V1.

Since the above diagnosis is based on the assumption that no leak occurs in the valve V2, it is preferable to perform the abnormality diagnosis for the valve V2.

<Seat Leakage Abnormality Diagnosis of Valve V2>

First step (valve operation step): the valve V1 is opened.

Second step (valve operation step): the valve FV in the flow rate control device is opened.

Third step (valve operation step): the valve V2 is closed.

Fourth step (pressure adjustment step): the fluid is flown in from the side of the valve V1, and the inside of the flow passages R1 and R2 leading from the valve portion of the valve V1 to the valve portion of the valve V2 via the flow passage of the flow rate control device F is pressurized.

Fifth step (valve operation step): when the inside of the flow passages R1 and R2 is pressurized, the valve FV in the flow rate control device is closed.

Sixth step (pressure detection step): the temporal pressure characteristics in the flow passage R2 are acquired by the pressure detection mechanisms P1 and P2.

Seventh step (abnormality determination step): the pressure characteristics in the flow passage R2 acquired by the pressure detection mechanisms P1 and P2 and the pressure characteristics at the time of normality measured in advance under the same conditions are compared and the presence or absence of an abnormality is determined.

Since the valve FV in the flow rate control device and the valve V2 are closed, the inside of the flow passage R2 maintains a pressurization state in the normal case. On the contrary, when the pressure in the flow passage R2 gradually decreases, it is assumed that the fluid leaks from the valve V2 to the downstream, and it is diagnosed that an abnormality occurs in the valve V2.

Since the above diagnosis is based on the assumption that no leak occurs in the valve FV in the flow rate control device, it is preferable to perform the abnormality diagnosis for the valve FV in the flow rate control device.

<Diagnosis of Change in Cv Value of Valve V2>

First step (valve operation step): the valve V1 is opened.

Second step (valve operation step): the valve FV in the flow rate control device is opened.

Third step (valve operation step): the valve V2 is closed.

Fourth step (pressure adjustment step): the fluid is flown in from the side of the valve V1, and the inside of the flow passage R2 is pressurized.

Fifth step (valve operation step): when the inside of the flow passage R2 is pressurized, the valve FV in the flow rate control device is closed.

Sixth step (valve operation step): the valve V2 is opened.

Seventh step (pressure detection step): the temporal pressure characteristics in the flow passage R2 are acquired by the pressure detection mechanisms P1 and P2.

Eighth step (abnormality determination step): the pressure characteristics in the flow passage R2 acquired by the pressure detection mechanisms P1 and P2 and the pressure characteristics at the time of normality measured in advance under the same conditions are compared and the presence or absence of an abnormality is determined.

A Cv value is a flow rate coefficient of the fluid under a predetermined condition.

Since the valve FV in the flow rate control device is closed, but the valve V2 is opened, the fluid flows out to the downstream while exhibiting a predetermined Cv value characteristic in the normal case. On the other hand, when the Cv value characteristic at the time of normality is not exhibited, it is assumed that a failure such as clogging or corrosion occurs in the valve portion of the valve V2, and it is diagnosed that an abnormality occurs in the valve V2. When the fluid flows out earlier than the Cv value characteristic at the time of normality, it is assumed that a valve seat is crushed and the flow passage is expanded, or the stroke is increased by settling of a spring. When the fluid flows out later than the Cv value characteristic at the time of normality, it is assumed that clogging occurs.

Since the above diagnosis is based on the assumption that no leak occurs in the valve FV in the flow rate control device, it is preferable to perform the abnormality diagnosis for the valve FV in the flow rate control device.

According to the abnormality diagnosis method of the fluid supply line according to the embodiment described above, it is possible to diagnosis the abnormality of the fluid control device from the operation of the entire fluid supply line L1 including the plurality of fluid control devices such as the valve V2, the valve V1, and the flow rate control device F. In particular, as described above, in the fluid supply line L1 to which the abnormality diagnosis method of the fluid supply line is applied, the cable for performing the power supply or the communication is simply configured, and the inner volume of the tube for supplying the drive pressure is small. Therefore, noise reduction, delay suppression of a transmission speed of an instruction signal, maintenance of an opening/closing speed of each fluid control device, and error suppression of the opening/closing speed of each fluid control device are realized. As a result, with regard to the abnormality diagnosis of each fluid control device, it is possible to diagnose the fluid supply line L1 more accurately and precisely by suppressing a variation in the operation of each fluid control device.

In the present embodiment, the flow rate control device F includes the two pressure detection mechanisms P1 and P2. However, basically, if only one pressure detection mechanism is provided, the same diagnosis can be realized.

However, in the Cv value change diagnosis of the valve V2, since the orifice OR cannot be closed, the pressures of the upstream side and the downstream side of the orifice OR are measured by the pressure detection mechanisms P1 and P2, so that it is possible to diagnose a change in the Cv value while determining the presence or absence of the abnormality of the orifice OR.

Further, the two pressure detection mechanisms P1 and P2 are provided on the upstream side and the downstream side with the orifice OR interposed therebetween. For this reason, in the abnormality determination step, when the pressure in the flow passage R1 and/or the flow passage R2 in the pressurization state or the vacuum state decreases or increases, a time lag occurs in the detection of the pressure decrease or increase by the pressure detection mechanisms P1 and P2. For example, in the above-described <seat leakage abnormality diagnosis of valve V1>, in the case where the pressures in the flow passages R1 and R2 in the vacuum state increase, if the seat leakage occurs in the valve V1, the pressure detection mechanism P1 on the side of the valve V1 detects the pressure increase first, and the pressure detection mechanism P2 detects the pressure increase with a delay. On the other hand, if the seat leakage occurs in the valve V2, the pressure detection mechanism P2 on the side of the valve V2 detects the pressure increase first, and the pressure detection mechanism P1 detects the pressure increase with a delay.

Similarly, for other abnormality diagnosis, it is possible to determine which of the valve FV in the flow rate control device and the valve V2 has an abnormality in the case of <seat leakage abnormality diagnosis of valve FV in flow rate control device>, it is possible to determine which of the valve V2 and the valve FV in the flow rate control device has an abnormality in the case of <seat leakage abnormality diagnosis of valve V2>, and it is possible to determine which of the valve V2 and the valve FV in the flow rate control device has an abnormality in the case of <diagnosis of change in Cv value of valve V2>.

As described above, by detecting the time lag of the pressure decrease or increase in the pressure detection mechanisms P1 and P2, it is possible to determine which of the valve portions of the fluid control devices of the upstream and downstream sides configuring a closed space has an abnormality. In particular, the orifice OR is interposed between the pressure detection mechanisms P1 and P2, so that the time lag can be practically measured. Further, if a highly accurate gas unit 1 is configured by performing wiring as in the fluid supply line L described above and suppressing a variation in operation of each of a plurality of fluid control devices, a time lag of a minute time can also be accurately detected.

The embodiments of the present invention are not limited to the above-described embodiments, and those skilled in the art can change or add various configurations, mechanisms, or functions without departing from the scope of the present invention.

REFERENCE SIGNS LIST 1, 2 Gas unit
10, 10a, 10b, 10c Main cable
101, 102 Branch cable
11, 12, 13 Extension cable 111, 112, 113, 114 Sub-cable
121, 122, 123, 124 Sub-cable
131, 132, 133, 134 Sub-cable
20, 20a, 20b, 20c Main tube
21, 22, 23 Extension tube
211, 212, 213 Extension tube
214, 215, 216, 217, 218 Sub-tube
221, 222, 223 Extension tube
224, 225, 226, 227, 228 Sub-tube
231, 232, 233 Extension tube
234, 235, 236, 327237, 238 Sub-tube
L1, L2, L3 Fluid supply line
C1, C2, C3 Branch connector
F(F1, F2, F3) Flow rate control device
FV Valve in flow rate control device
J1 Branch joint
J11, J111, J112, J113 Joint
J12, J121, J122, J123 Joint
J13, J131, J132, J133 Joint
OR Orifice
P1, P2 Pressure detection mechanism
R1, R2 Flow passage
V(V11 to V14, V21 to 24, V31 to 34), V1, V2 Valve

The invention claimed is:

1. An abnormality diagnosis method of a fluid supply line including a plurality of fluid control devices communicating with each other fluid-tightly, the abnormality diagnosis method comprising:
   a valve operation step of opening/closing any one or more of a valve in a flow rate control device, a first valve, and a second valve;
   a pressure adjustment step of setting a part or all of flow passages leading from the first valve to the second valve via the flow rate control device to a vacuum state or a pressurization state;
   a pressure detection step of acquiring temporal pressure characteristics in the flow passage of the flow rate control device by a pressure detection mechanism; and
   an abnormality determination step of comparing pressure characteristics at a time of abnormality diagnosis acquired by the pressure detection mechanism and pressure characteristics at a time of normality measured in advance under the same conditions, and determining whether or not there is an abnormality;
   wherein the fluid supply line includes
   the flow rate control device that is connected to a mechanism outside the fluid supply line by a first connection mechanism and has the valve in the flow rate control device and the pressure detection mechanism that detects a pressure in the flow passage,
   the first valve that is connected to the mechanism outside the fluid supply line by a second connection mechanism branched from the first connection mechanism and is disposed on an upstream side of the flow rate control device, and
   the second valve that is connected to the mechanism outside the fluid supply line by the second connection mechanism branched from the first connection mechanism and is disposed on a downstream side of the flow rate control device,
   wherein the valve operation step comprises
   a first step of opening the first valve,
   a second step of closing the valve in the flow rate control device,
   a third step of opening the second valve, and
   a fifth step of closing the second valve from a state where an inside of a flow passage leading from a valve portion of the valve in the flow rate control device to a valve portion of the second valve is evacuated,
   the pressure adjustment step comprises
   a fourth step of setting the inside of the flow passage leading from the valve portion of the valve in the flow rate control device to the valve portion of the second valve to a vacuum state, after the third step, and
   the pressure detection step comprises
   a sixth step of acquiring temporal pressure characteristics in the flow passage leading from the valve portion of the valve in the flow rate control device to the valve portion of the second valve by the pressure detection mechanism, after executing the fifth step.

2. An abnormality diagnosis method of a fluid supply line including a plurality of fluid control devices communicating with each other fluid-tightly, the abnormality diagnosis method comprising:
   a valve operation step of opening/closing any one or more of a valve in a flow rate control device, a first valve, and a second valve;
   a pressure adjustment step of setting a part or all of flow passages leading from the first valve to the second valve via the flow rate control device to a vacuum state or a pressurization state;
   a pressure detection step of acquiring temporal pressure characteristics in the flow passage of the flow rate control device by a pressure detection mechanism; and
   an abnormality determination step of comparing pressure characteristics at a time of abnormality diagnosis acquired by the pressure detection mechanism and pressure characteristics at a time of normality measured in advance under the same conditions, and determining whether or not there is an abnormality;
   wherein the fluid supply line includes
   the flow rate control device that is connected to a mechanism outside the fluid supply line by a first connection mechanism and has the valve in the flow rate control device and the pressure detection mechanism that detects a pressure in the flow passage,
   the first valve that is connected to the mechanism outside the fluid supply line by a second connection mechanism branched from the first connection mechanism and is disposed on an upstream side of the flow rate control device, and
   the second valve that is connected to the mechanism outside the fluid supply line by the second connection mechanism branched from the first connection mechanism and is disposed on a downstream side of the flow rate control device,
   wherein the valve operation step comprises
   a first step of closing the first valve,
   a second step of opening the valve in the flow rate control device,
   a third step of opening the second valve, and
   a fifth step of closing the second valve from a state where an inside of a flow passage leading from a valve portion of the first valve to a valve portion of the second valve via the flow passage of the flow rate control device is evacuated,
   the pressure adjustment step comprises
   a fourth step of setting the inside of the flow passage leading from the valve portion of the first valve to the valve portion of the second valve via the flow passage of the flow rate control device to a vacuum state, after the third step, and
   the pressure detection step comprises a sixth step of acquiring temporal pressure characteristics in the flow passage leading from the valve portion of the first valve to the valve portion of the second valve via the flow passage of the flow rate control device by the pressure detection mechanism, after executing the fifth step.

3. An abnormality diagnosis method of a fluid supply line including a plurality of fluid control devices communicating with each other fluid-tightly, the abnormality diagnosis method comprising:
  a valve operation step of opening/closing any one or more of a valve in a flow rate control device, a first valve, and a second valve;
  a pressure adjustment step of setting a part or all of flow passages leading from the first valve to the second valve via the flow rate control device to a vacuum state or a pressurization state;
  a pressure detection step of acquiring temporal pressure characteristics in the flow passage of the flow rate control device by a pressure detection mechanism; and
  an abnormality determination step of comparing pressure characteristics at a time of abnormality diagnosis acquired by the pressure detection mechanism and pressure characteristics at a time of normality measured in advance under the same conditions, and determining whether or not there is an abnormality;
  wherein the fluid supply line includes
  the flow rate control device that is connected to a mechanism outside the fluid supply line by a first connection mechanism and has the valve in the flow rate control device and the pressure detection mechanism that detects a pressure in the flow passage,
  the first valve that is connected to the mechanism outside the fluid supply line by a second connection mechanism branched from the first connection mechanism and is disposed on an upstream side of the flow rate control device, and
  the second valve that is connected to the mechanism outside the fluid supply line by the second connection mechanism branched from the first connection mechanism and is disposed on a downstream side of the flow rate control device,
  wherein the valve operation step comprises
  a first step of opening the first valve,
  a second step of opening the valve in the flow rate control device,
  a third step of closing the second valve, and
  a fifth step of closing the valve in the flow rate control device from a state where an inside of a flow passage leading from a valve portion of the first valve to a valve portion of the second valve via the flow passage of the flow rate control device is pressurized,
  the pressure adjustment step comprises
  a fourth step of setting the inside of the flow passage leading from the valve portion of the first valve to the valve portion of the second valve via the flow passage of the flow rate control device to a pressurization state, after the third step, and
  the pressure detection step comprises
  a sixth step of acquiring temporal pressure characteristics in the flow passage leading from the valve portion of the first valve to the valve portion of the second valve via the flow passage of the flow rate control device by the pressure detection mechanism, after executing the fifth step.

4. An abnormality diagnosis method of a fluid supply line including a plurality of fluid control devices communicating with each other fluid-tightly, the abnormality diagnosis method comprising:
  a valve operation step of opening/closing any one or more of a valve in a flow rate control device, a first valve, and a second valve;
  a pressure adjustment step of setting a part or all of flow passages leading from the first valve to the second valve via the flow rate control device to a vacuum state or a pressurization state;
  a pressure detection step of acquiring temporal pressure characteristics in the flow passage of the flow rate control device by a pressure detection mechanism; and
  an abnormality determination step of comparing pressure characteristics at a time of abnormality diagnosis acquired by the pressure detection mechanism and pressure characteristics at a time of normality measured in advance under the same conditions, and determining whether or not there is an abnormality;
  wherein the fluid supply line includes
  the flow rate control device that is connected to a mechanism outside the fluid supply line by a first connection mechanism and has the valve in the flow rate control device and the pressure detection mechanism that detects a pressure in the flow passage,
  the first valve that is connected to the mechanism outside the fluid supply line by a second connection mechanism branched from the first connection mechanism and is disposed on an upstream side of the flow rate control device, and
  the second valve that is connected to the mechanism outside the fluid supply line by the second connection mechanism branched from the first connection mechanism and is disposed on a downstream side of the flow rate control device,
  wherein the valve operation step comprises
  a first step of opening the first valve,
  a second step of opening the valve in the flow rate control device,
  a third step of closing the second valve,
  a fifth step of closing the valve in the flow rate control device from a state where an inside of a flow passage leading from a valve portion of the valve in the flow rate control device to a valve portion of the second valve is pressurized, and
  a sixth step of opening the second valve after closing the valve in the flow rate control device,
  the pressure adjustment step comprises
  a fourth step of setting the inside of the flow passage leading from the valve portion of the valve in the flow rate control device to the valve portion of the second valve to a pressurization state, after the third step, and
  the pressure detection step comprises
  a seventh step of acquiring temporal pressure characteristics in the flow passage leading from the valve portion of the valve in the flow rate control device to the valve portion of the second valve by the pressure detection mechanism, after executing the sixth step.

5. An abnormality diagnosis method of a fluid supply line including a plurality of fluid control devices communicating with each other fluid-tightly, the abnormality diagnosis method comprising:
  a valve operation step of opening/closing any one or more of a valve in a flow rate control device, a first valve, and a second valve;

a pressure adjustment step of setting a part or all of flow passages leading from the first valve to the second valve via the flow rate control device to a vacuum state or a pressurization state;

a pressure detection step of acquiring temporal pressure characteristics in the flow passage of the flow rate control device by a pressure detection mechanism; and an abnormality determination step of comparing pressure characteristics at a time of abnormality diagnosis acquired by the pressure detection mechanism and pressure characteristics at a time of normality measured in advance under the same conditions, and determining whether or not there is an abnormality;

wherein the fluid supply line includes the flow rate control device that is connected to a mechanism outside the fluid supply line by a first connection mechanism and has the valve in the flow rate control device and the pressure detection mechanism that detects a pressure in the flow passage, the first valve that is connected to the mechanism outside the fluid supply line by a second connection mechanism branched from the first connection mechanism and is disposed on an upstream side of the flow rate control device, and the second valve that is connected to the mechanism outside the fluid supply line by the second connection mechanism branched from the first connection mechanism and is disposed on a downstream side of the flow rate control device, wherein a plurality of the fluid supply lines are arranged in parallel to configure a gas unit, and the first connection mechanism branches for each of the plurality of fluid supply lines in the vicinity of the gas unit, and is connected to each predetermined fluid control device on the plurality of fluid supply lines.

6. An abnormality diagnosis method of a fluid supply line according to claim 1, including a plurality of fluid control devices communicating with each other fluid-tightly, the abnormality diagnosis method comprising:

a valve operation step of opening/closing any one or more of a valve in a flow rate control device, a first valve, and a second valve;

a pressure adjustment step of setting a part or all of flow passages leading from the first valve to the second valve via the flow rate control device to a vacuum state or a pressurization state;

a pressure detection step of acquiring temporal pressure characteristics in the flow passage of the flow rate control device by a pressure detection mechanism; and an abnormality determination step of comparing pressure characteristics at a time of abnormality diagnosis acquired by the pressure detection mechanism and pressure characteristics at a time of normality measured in advance under the same conditions, and determining whether or not there is an abnormality;

wherein the fluid supply line includes the flow rate control device that is connected to a mechanism outside the fluid supply line by a first connection mechanism and has the valve in the flow rate control device and the pressure detection mechanism that detects a pressure in the flow passage, the first valve that is connected to the mechanism outside the fluid supply line by a second connection mechanism branched from the first connection mechanism and is disposed on an upstream side of the flow rate control device, and the second valve that is connected to the mechanism outside the fluid supply line by the second connection mechanism branched from the first connection mechanism and is disposed on a downstream side of the flow rate control device, wherein the flow rate control device is a flow rate range variable type flow rate control device, and the flow rate range variable type flow rate control device has at least a fluid passage for a small flow rate and a fluid passage for a large flow rate as a fluid passage to a flow rate detection unit of the flow rate control device, and the flow rate range variable type flow rate control device circulates a fluid in a small flow rate region to the flow rate detection unit through the fluid passage for the small flow rate and switches a detection level of a flow rate control unit to a detection level suitable for detection of the flow rate of the small flow rate region, and circulates a fluid in a large flow rate region to the flow rate detection unit through the fluid passage for the large flow rate and switches the detection level of the flow rate control unit to a detection level suitable for detection of the flow rate of the large flow rate region, thereby switching the fluid in each of the large flow rate region and the small flow rate region to control the flow rate.

7. An abnormality diagnosis method of a fluid supply line including a plurality of fluid control devices communicating with each other fluid-tightly, the abnormality diagnosis method comprising:

a valve operation step of opening/closing any one or more of a valve in a flow rate control device, a first valve, and a second valve;

a pressure adjustment step of setting a part or all of flow passages leading from the first valve to the second valve via the flow rate control device to a vacuum state or a pressurization state;

a pressure detection step of acquiring temporal pressure characteristics in the flow passage of the flow rate control device by a pressure detection mechanism; and an abnormality determination step of comparing pressure characteristics at a time of abnormality diagnosis acquired by the pressure detection mechanism and pressure characteristics at a time of normality measured in advance under the same conditions, and determining whether or not there is an abnormality;

wherein the fluid supply line includes the flow rate control device that is connected to a mechanism outside the fluid supply line by a first connection mechanism and has the valve in the flow rate control device and the pressure detection mechanism that detects a pressure in the flow passage, the first valve that is connected to the mechanism outside the fluid supply line by a second connection mechanism branched from the first connection mechanism and is disposed on an upstream side of the flow rate control device, and the second valve that is connected to the mechanism outside the fluid supply line by the second connection mechanism branched from the first connection mechanism and is disposed on a downstream side of the flow rate control device, wherein the flow rate control device is a differential pressure type flow rate control device, and the differential pressure type flow rate control device has a control valve including a valve drive unit, an orifice provided on a downstream side of the control valve, a detector for a fluid pressure of an upstream side of the orifice, a detector for a fluid pressure of a downstream side of the orifice, a detector for a fluid temperature of the upstream side of the orifice, and a control arithmetic circuit including a flow rate comparison circuit that calculates a fluid flow rate using a detection pressure and a detection temperature from each of the detectors and calculates a difference between the calculated flow rate and a setting flow rate.

* * * * *